(12) United States Patent
Im

(10) Patent No.: US 11,520,652 B2
(45) Date of Patent: Dec. 6, 2022

(54) MEMORY DEVICE AND OPERATING METHOD OF THE SAME

(71) Applicant: Samsung Electronics Co., Ltd., Suwon-si (KR)

(72) Inventor: Doyoung Im, Gimpo-si (KR)

(73) Assignee: Samsung Electronics Co., Ltd.

( * ) Notice: Subject to any disclaimer, the term of this patent is extended or adjusted under 35 U.S.C. 154(b) by 118 days.

(21) Appl. No.: 17/024,826

(22) Filed: Sep. 18, 2020

(65) Prior Publication Data

US 2021/0255916 A1 Aug. 19, 2021

(30) Foreign Application Priority Data

Feb. 14, 2020 (KR) ........................ 10-2020-0018186

(51) Int. Cl.
*G06F 11/07* (2006.01)
*G11C 13/00* (2006.01)
*G06F 11/20* (2006.01)
*H01L 27/24* (2006.01)

(52) U.S. Cl.
CPC ...... *G06F 11/0793* (2013.01); *G06F 11/0727* (2013.01); *G06F 11/0754* (2013.01); *G06F 11/2094* (2013.01); *G11C 13/0004* (2013.01); *G11C 13/004* (2013.01); *G11C 13/0033* (2013.01); *G11C 13/0064* (2013.01); *G11C 13/0069* (2013.01); *G06F 2201/82* (2013.01); *H01L 27/2427* (2013.01); *H01L 27/2481* (2013.01)

(58) Field of Classification Search
CPC ............ G11C 13/0004; G11C 13/0033; G11C 13/004; G11C 13/0064; G11C 13/0069; G06F 11/0793; G06F 11/0727; G06F 11/0754; G06F 11/2094; G06F 2201/82; H01L 27/2427; H01L 27/2481
USPC ..................................... 365/189.01, 189.011
See application file for complete search history.

(56) References Cited

U.S. PATENT DOCUMENTS

| | | | |
|---|---|---|---|
| 9,257,175 B2 * | 2/2016 | Pangal | G11C 13/0033 |
| 10,438,658 B2 * | 10/2019 | Xie | G11C 13/0004 |
| 2015/0089120 A1 | 3/2015 | Pangal et al. | |
| 2016/0027508 A1 | 1/2016 | Lee et al. | |
| 2016/0211032 A1 | 7/2016 | Pang et al. | |
| 2016/0240253 A1 | 8/2016 | Zhou et al. | |
| 2018/0366189 A1 | 12/2018 | Bedeschi et al. | |
| 2019/0043580 A1 | 2/2019 | Pirovano et al. | |
| 2019/0121692 A1 | 4/2019 | Berger et al. | |

(Continued)

*Primary Examiner* — Son L Mai
(74) *Attorney, Agent, or Firm* — Myers Bigel, P.A.

(57) ABSTRACT

A memory device includes a memory cell array including memory cells connected to word lines and bit lines. Each of the memory cells includes a switch element and a memory element, and has a first state or a second state in which a threshold voltage is within a first voltage range or a second voltage range, lower than the first voltage range. A memory controller is configured to execute a first read operation for the memory cells using a first read voltage, higher than a median value of the first voltage range, program first defect memory cells turned off during the first read operation to the first state, execute a second read operation for the memory cells using a second read voltage, lower than a median value of the second voltage range, and execute a repair operation for second defect memory cells turned on during the second read operation.

20 Claims, 20 Drawing Sheets

(56) References Cited

U.S. PATENT DOCUMENTS

| | | |
|---|---|---|
| 2019/0206506 A1 | 7/2019 | Tortorelli et al. |
| 2019/0278502 A1 | 9/2019 | Kanno |
| 2019/0310936 A1 | 10/2019 | Novogran et al. |

* cited by examiner

MEMORY DEVICE AND OPERATING METHOD OF THE SAME

CROSS-REFERENCE TO RELATED APPLICATION

This application claims benefit of priority to Korean Patent Application No. 10-2020-0018186 filed on Feb. 14, 2020, in the Korean Intellectual Property Office, the disclosure of which is incorporated herein by reference in its entirety.

FIELD

The present disclosure relates to a memory device and an operating method thereof.

BACKGROUND

A memory device may provide a function of writing or deleting data, or a function of reading the written data. The memory device includes a plurality of memory cells and may program data by controlling a threshold voltage of each memory cell. A distribution of the threshold voltages of the memory cells may be used in reading data stored in the memory cells.

SUMMARY

Some embodiments of the present disclosure provide a memory device having improved reliability by sensing a change in threshold voltages of memory cells due to various factors and executing a refresh and/or repair operation if necessary.

According to an aspect of the present disclosure, a memory device comprises a memory cell array including a plurality of memory cells connected to a plurality of word lines and a plurality of bit lines, where each of the plurality of memory cells includes a switch element and a memory element connected to each other and has a first state in which a threshold voltage is within a first voltage range or a second state in which the threshold voltage is within a second voltage range that is lower than the first voltage range; and a memory controller configured to execute a first read operation for the plurality of memory cells using a first read voltage that is higher than a median value of the first voltage range, program first defect memory cells of the plurality of memory cells that are turned off during the first read operation to the first state, execute a second read operation for the plurality of memory cells using a second read voltage that is lower than a median value of the second voltage range, and execute a repair operation for second defect memory cells of the plurality of memory cells that are turned on during the second read operation.

According to an aspect of the present disclosure, a memory device comprises a plurality of memory cells connected to a plurality of word lines and a plurality of bit lines, each of the plurality of memory cells having a respective threshold voltage that is equal to or lower than a first threshold voltage and equal to or higher than a second threshold voltage of a program operation, where the second threshold voltage is lower than the first threshold voltage; and a memory controller that is configured to execute, for a target memory cell among the plurality of memory cells, a verification operation by applying at least one of a first verification voltage that is higher than the first threshold voltage, or a second verification voltage that is lower than the second threshold voltage, where the memory controller is configured to execute a refresh operation for the target memory cell responsive to the respective threshold voltage of the target memory cell being higher than the first verification voltage and is configured to execute a repair operation for the target memory cell responsive to the respective threshold voltage of the target memory cell being lower or equal to than the second verification voltage.

According to an aspect of the present disclosure, a memory device comprises a memory cell array including a plurality of memory cells connected to a plurality of word lines and a plurality of bit lines, where each of the plurality of memory cells has a first state having a first threshold voltage in a first voltage range or a second state having a second threshold voltage in a second voltage range that is lower than the first voltage range; and a memory controller configured to execute a verification operation for the plurality of memory cells using a verification voltage that is higher than a maximum value of the first voltage range or lower than a minimum value of the second voltage range, and to execute a read operation for the plurality of memory cells using a read voltage that is equal to or lower than a minimum value of the first voltage range and equal to or higher than a maximum value of the second voltage range, where the memory controller is configured to apply a first bit line voltage to the plurality of bit lines during the read operation and a second bit line voltage that is different from the first bit line voltage to the plurality of bit lines during the verification operation.

According to an aspect of the present disclosure, an operation method of a memory device includes executing a control operation on a plurality of memory cells having a first state having a first threshold voltage within a first voltage range or a second state having a second threshold voltage within a second voltage range that is lower than the first voltage range, through a plurality of word lines and a plurality of bit lines; executing a verification operation on at least one target memory cell, among the plurality of memory cells, using a verification voltage that is higher than a maximum value of the first voltage range or lower than a minimum value of the second voltage range responsive to a predetermined period of time elapsing; and executing at least one of a refresh operation or a repair operation on a defect memory cell, among the plurality of memory cells, which is determined to have a respective threshold voltage that is higher than the maximum value of the first voltage range or lower than the minimum value of the second voltage range during the verification operation.

BRIEF DESCRIPTION OF DRAWINGS

The above and other aspects, features, and advantages of the present disclosure will be more clearly understood from the following detailed description, taken in conjunction with the accompanying drawings, in which.

DETAILED DESCRIPTION

Hereinafter, preferred embodiments of the present disclosure will be described with reference to the accompanying drawings.

Figure 1:
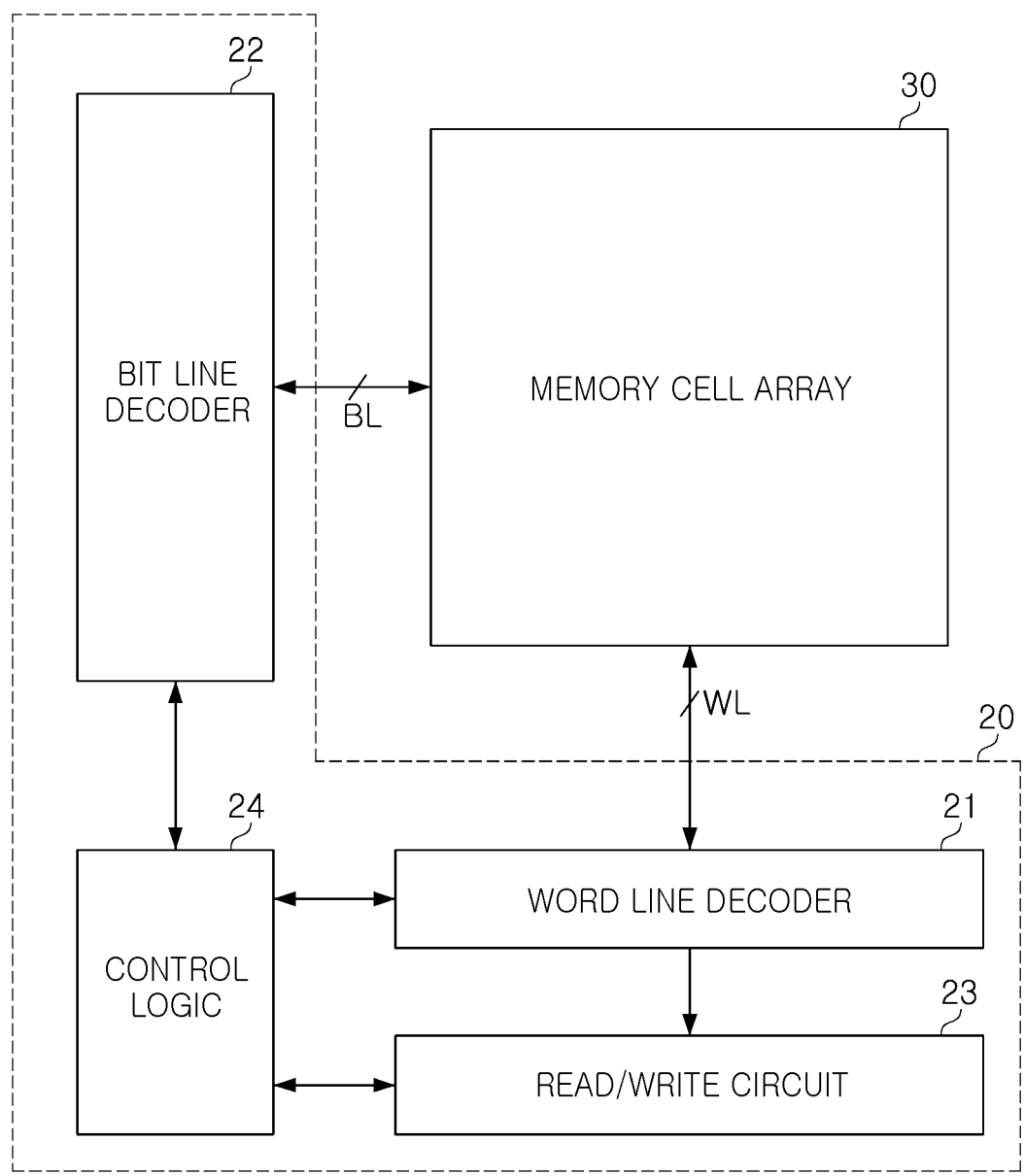
FIG. 1 is a block diagram illustrating a memory device according to an example embodiment of the present disclosure.

FIG. 1 is a block diagram illustrating a memory device according to an example embodiment of the present disclosure.

A memory device 10 according to an example embodiment may include a memory controller 20 and a memory cell array 30. The memory controller 20 may include decoder circuits 21 and 22, a reading/writing circuit 23, a control logic 24, or the like. The memory cell array 30 may include a plurality of memory cells.

The decoder circuits 21 and 22 may include a word line decoder 21 connected to a plurality of the memory cells through word lines WL a bit line decoder 22 connected to a plurality of the memory cells through bit lines BL. Operations of the word line decoder 21, the bit line decoder 22 and the reading/writing circuit 23 may be controlled by the control logic 24. In an example embodiment, the reading/writing circuit 23 may include a programming circuit configured to record data in at least one selected memory cell specified by the word line decoder 21 and the bit line decoder 22, a readout circuit reading data from the selected memory cell, or the like.

The control logic 24 may determine a selected memory cell, among the memory cells included in the memory cell array 30, through the word line decoder 21 and the bit line decoder 22. During the program operation, the read operation, or the like, the word line decoder 21 and the bit line decoder 22 may input into the selected memory cell a voltage different from unselected memory cells.

In the memory device 10, the word line decoder 21 and the bit line decoder 22 may be disposed in a lower portion of the memory cell array 30. In other words, the memory cell array 30 may be stacked in an upper portion of the word line decoder 21 and the bit line decoder 22. A wiring design connecting the word lines WL and the word line decoder 21 and the bit lines BL and the bit line decoder 22 may be simplified using such a structure. Depending on example embodiments, the reading/writing circuit 23 may also be disposed in the lower portion of the memory cell array 30 along with the word line decoder 21 and the bit line decoder 22.

Figure 2:
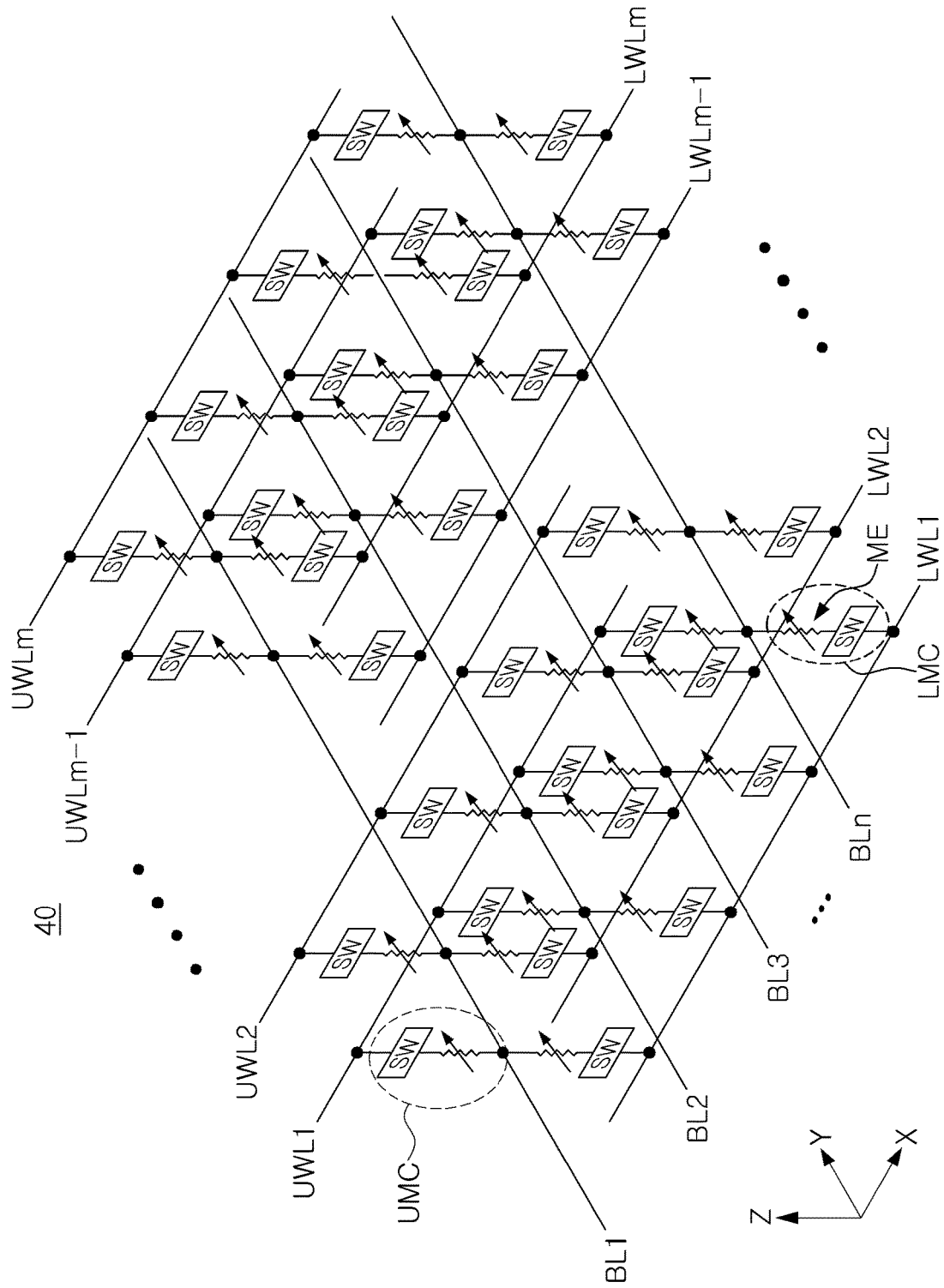
FIG. 2 is a diagram illustrating a memory cell array of a memory cell according to an example embodiment of the present disclosure.

FIG. 2 is a diagram illustrating a memory cell array of a memory cell according to an example embodiment.

Based on FIG. 2, a memory cell array 40 may include bit lines BL1 to BLn extending in a first direction (Y-axis direction), word lines LWL1 to LWLm and UWL1 to UWLm extending in a second direction (X-axis direction). The first direction and the second direction intersect each other, and as an example, may be perpendicular to each other. As used herein, the terms "first," "second," etc. are used merely to distinguish one element, direction, or state, from another.

Lower memory cells LMC may be disposed between the bit lines BL1 to BLn and the word lines LWL1 to LWLm and UWL1 to UWLm. The lower memory cells LMC and upper memory cells UMC may have an identical structure.

For example, each of the lower memory cells LMC and the upper memory cells UMC may have a switch element SW and a memory element ME. In an example embodiment, the switch element may include a PN junction diode, a short key diode and/or an ovonic threshold switch OTS. Meanwhile, in an example embodiment, the memory element ME may be formed of a phase-change material containing a chalcogenide material, a super-lattice, or the like. That is, the memory element ME may contain a phase-change material, which can be phase-changed between an amorphous phase and a crystalline phase, depending on a heating time, a temperature, or the like.

In each of the memory cells LMC and UMC, the memory element ME and the switch element SW may be serially connected to each other. As used herein, a connection refers to an electrical connection. A connection order of the memory element ME and the switch element SW may be as shown in FIG. 2 or may be modified. As an example, in contrast to the embodiment of FIG. 2, the memory element ME and the switch element SW may be connected in order between the word lines LWL1 to LWLm and UWL1 to UWLm and the bit lines BL1 to BLn.

In an example embodiment illustrated in FIG. 2, the bit lines BL1 to BLn are disposed between the lower and upper memory cells LMC and UMC in a third direction (Z-axis direction) and may be shared by the lower and upper memory cells LMC and UMC. However, this is merely an example, and a structure of the memory cell array 40 may be modified. As an example, the word lines may be disposed between the lower and upper memory cells LMC and UMC, thereby allowing the lower and upper memory cells LMC and UMC to share the word lines. In this case, the lower memory cells LMC may be connected to lower bit lines while the upper memory cells UMC may be connected to upper bit lines.

Figure 3:
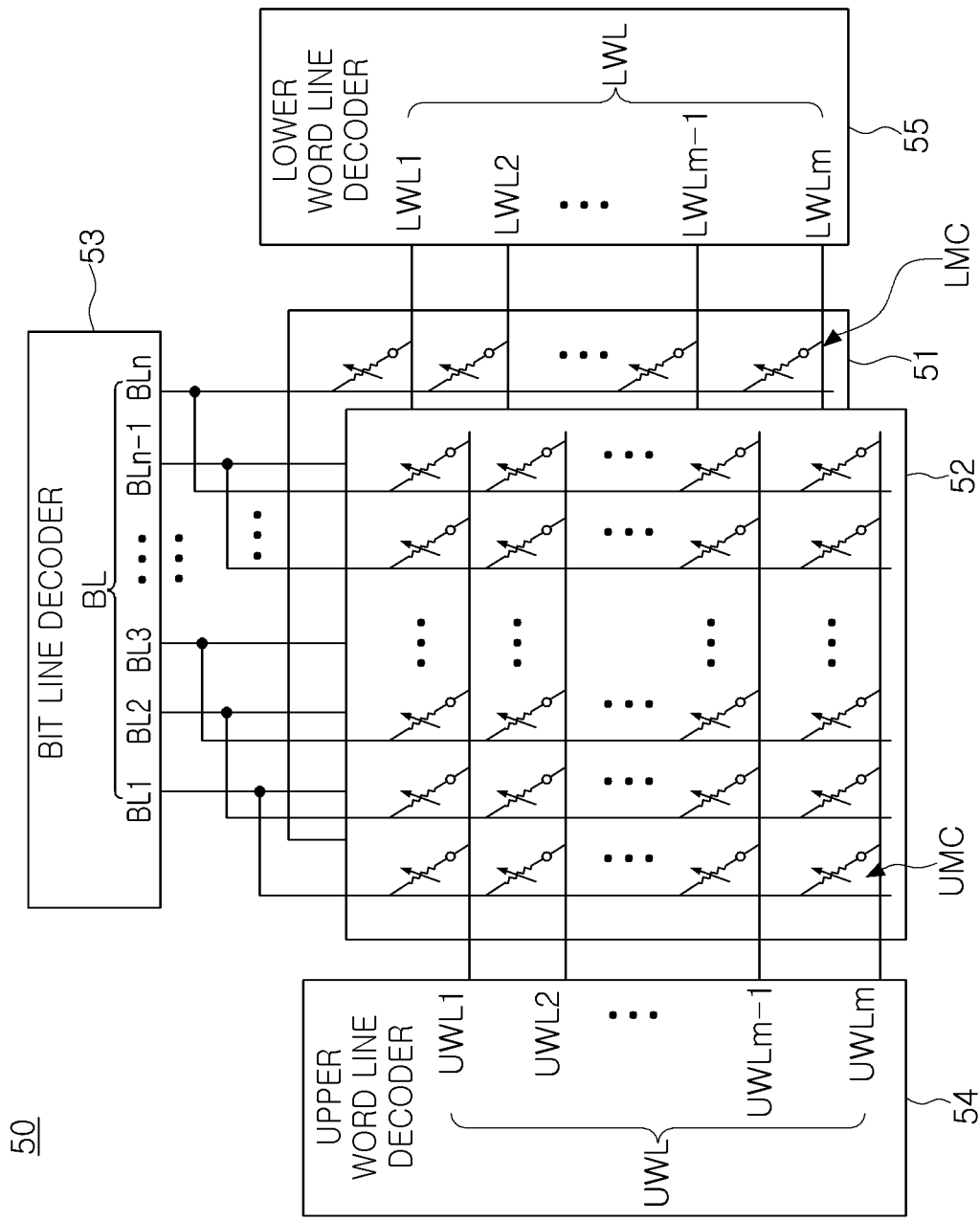
FIGS. 3 and 4 are block diagrams illustrating a memory device according to an example embodiment of the present disclosure.
Figure 4:
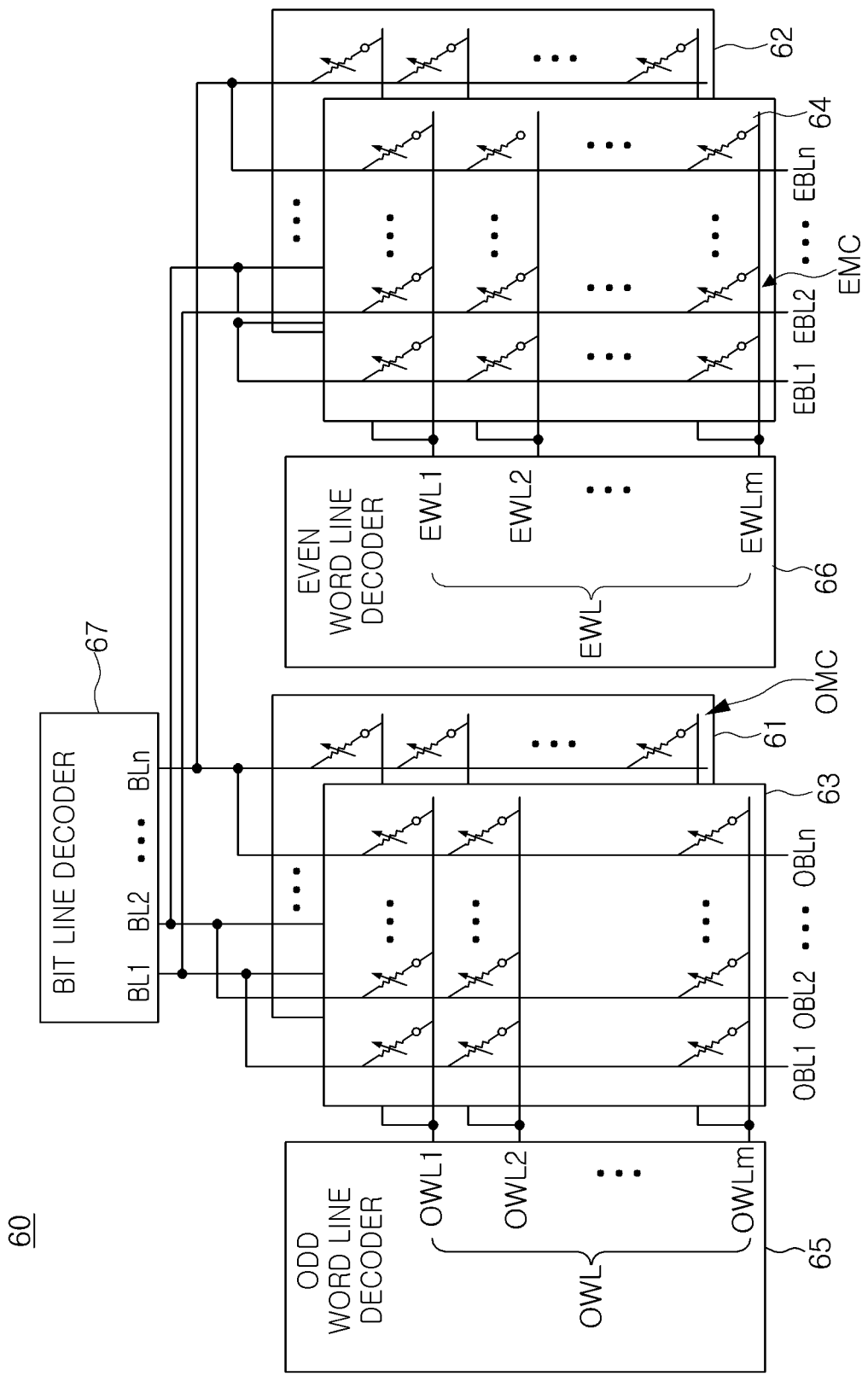

FIGS. 3 and 4 are block diagrams illustrating a memory device according to an example embodiment.

Referring to FIG. 3, a memory device 50 according to an example embodiment includes a plurality of memory layers 51 and 52, and a plurality of the memory layers 51 and 52 may include a first memory layer 51 and a second memory layer 52. The lower memory cells LMC included in the first memory layer 51 may be connected to the lower word lines LWL, and the upper memory cells UMC included in the second memory layer 52 may be connected to the upper word lines UWL.

The upper memory cells UMC and the lower memory cells LMC may share the bit lines BL. As an example, the upper memory cells UMC may be connected to the upper portion of the bit lines BL, and the lower memory cells LMC may be connected to the lower portion of the bit lines BL. Regardless of sharing of the bit lines BL, the upper and lower memory cells UMC and LMC may be independently controlled. For example, when the bit line decoder 53 selects a first bit line BL1 and an upper word line decoder 54 selects the first upper word line UWL1, the lower word line decoder 55 may not select the first lower word line LWL1. Accordingly, the upper memory cell UMC connected between the first bit line BL1 and the first upper word line UWL1 may be controlled.

In an example embodiment illustrated in FIG. 3, a number of the upper word lines UWL is illustrated as being the same as that of the lower word lines LWL, but is not necessarily limited thereto. As an example, a number of the upper word lines UWL may be higher than that of the lower word lines LWL, and accordingly, a number of the upper memory cells UMC may be higher than that of the lower memory cells LMC, or vice versa.

Referring to FIG. 4, a memory device 60 according to an example embodiment may include a plurality of memory layers 61 to 64. A plurality of the memory layers 61 to 64 may include a first memory layer 61, a second memory layer 62, a third memory layer 63 and a fourth memory layer 64, which are stacked in order. In an example embodiment, odd layer memory cells OMC included in the first and third memory layers 61 and 63 may be connected to an odd layer word line decoder 65 through odd word lines OWL. Even layer memory cells EMC included in the second and fourth memory layers 62 and 64 may be connected to an even layer word line decoder 66 through even word lines EWL. Depending on example embodiments, however, the memory layers 61 to 64 may be connected to different word line decoders.

In an example embodiment illustrated in FIG. 4, the bit lines BL may be shared by the odd layer memory cells OMC and the even layer memory cells EMC. The bit lines BL may include lower bit lines disposed between the first memory layer 61 and the second memory layer 62, and upper bit lines disposed between the third memory layer 63 and the fourth memory layer 64. As an example, the lower and upper bit lines disposed in a same position on a plane perpendicular to a direction in which the memory layers 61 to 64 are stacked may be electrically connected to each other. Accordingly, when selecting one of the bit lines BL with a bit line decoder 67, the lower bit lines and the upper bit lines may be simultaneously selected. Depending on example embodiments, however, the lower and upper bit lines may be electrically separated, and may be independently selected by different bit line decoders.

Figure 5:
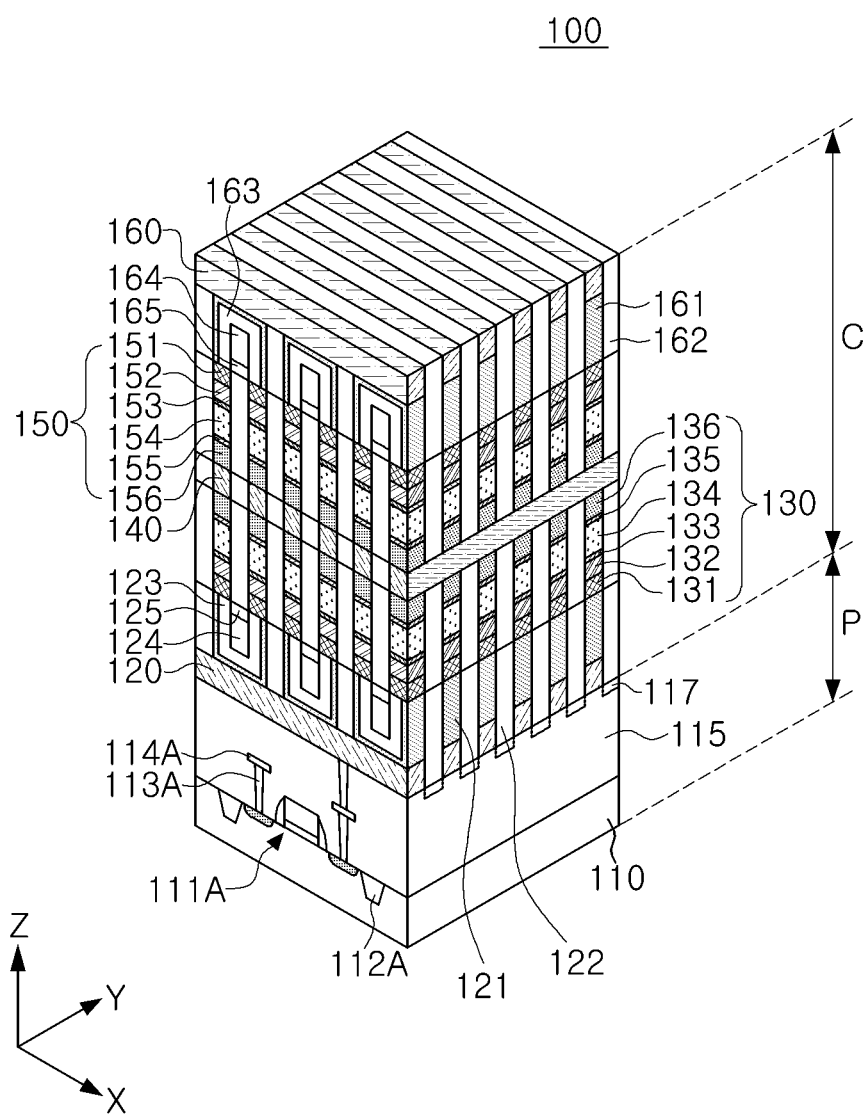
FIG. 5 is a diagram illustrating a structure of a memory device according to example embodiments of the present disclosure.

FIG. 5 is a diagram illustrating a structure of a memory device according to example embodiments.

Referring to FIG. 5, a memory device 100 may include a peripheral circuit region P having a plurality of circuit elements 111A formed on a semiconductor substrate 110, and a cell region C having a plurality of memory cells 130 and 150. The cell region C may include a plurality of bit lines 140 expanding in a first direction (Y-axis direction) and a plurality of word lines 120 and 160 extending in a second direction (X-axis direction).

As an example, the cell region C may include lower word lines 120 disposed below or in a lower portion of the bit lines 140 in a third direction (Z-axis direction) and upper word lines 160 disposed above or in an upper portion of the bit lines 140. Lower memory cells 130 may be disposed between the bit lines 140 and the lower word lines 120, and upper memory cells 150 may be disposed between the bit lines 140 and the upper word lines 160.

The circuit elements 111A may be adjacent to an element-isolating film in at least one of the first direction or the second direction, and may be connected to circuit wirings 114A through an element contact 113A. The circuit elements 111A may be covered by an interlayer insulating layer 115. As an example, the circuit elements 111A illustrated in FIG. 5 may provide a lower word line decoder connected to the lower word lines 120.

The lower word lines 120 may be connected to a heating electrode layer 121. In an example embodiment illustrated in FIG. 5, the heating electrode layer 121 is illustrated as being connected to a pair of lower memory cells 130 adjacent in the second direction, but is merely an example and thus is not limited thereto. For example, each of the lower memory cells 130 may be connected to a single heating electrode layer 121. Meanwhile, a recess portion 117 may be formed during manufacturing of the heating electrode layer 121 and the lower word lines 120.

The heating electrode layers 121 may be separated from each other by a lower insulating pattern 122. An insulating spacer 123 and inner insulating layers 124 and 125 may be disposed in the heating electrode layer 121. The lower insulating pattern 122, the insulating spacer 123 and the inner insulating layers 124 and 125 may be formed of a silicon oxide, a silicon nitride, or the like.

Each of the lower memory cells 130 may include a variable resistance layer 131 in contact with the heating electrode layer 121, a first electrode layer 132 and a selected element layer 134 stacked on the variable resistance layer 131, a second electrode layer 136, or the like. Depending on example embodiments, a first interface layer 133 and a second interface layer 135 may be disposed between the selected element layer 134 and the first electrode layer 132 and between the selected element layer 134 and the second electrode layer 136.

The variable resistance layer 131 may be formed of a material subject to a phase change by heat delivered from the heating electrode layer 121. As an example, the variable resistance layer 131 may contain Ge—Sb—Te (GST), or the like, a chalcogenide material. Alternatively, the variable resistance layer 131 may be formed of a material containing at least two elements selected from Si, Ge, Sb, Te, Bi, In, Sn and Se.

The selected element layer 134 may contain a material having varying resistance according to a magnitude of a voltage applied to both ends thereof, and may contain, for example, an ovonic threshold switching (OTS) material. The OTS material may contain a chalcogenide switching material. In an example embodiment, the selected element layer 134 may contain Si, Te, As, Ge, In, or a combination thereof or may further contain nitrogen. A material forming the selected element layer 134 is not limited to the above and may contain layers of various materials capable of selecting an element.

The upper memory cells 150, the heating electrode layer 161 and the upper word lines 160 may be disposed in the upper portion of the bit lines 140. Referring to FIG. 5, the heating electrode layer 161 is connected to the upper word lines 160, and the heating electrode layer 161 may be separated from each other by an upper insulating pattern 162. An insulating spacer 163 and an inner insulating layer 164 and 165 may be disposed in the heating electrode layer 161

The upper memory cells 150 may have a structure identical to that of the lower memory cells 130. For example, each of the upper memory cells 150 may include a variable resistance layer 151 in contact with the heating electrode layer 161, a first electrode layer 152 and a selected element layer 154 stacked on the variable resistance layer 151, a second electrode layer 156, or the like. Depending on example embodiments, a first interface layer 153 and a second interface layer 155 may be disposed between the selected element layer 154 and the first electrode layer 152 and between the selected element layer 154 and the second electrode layer 156.

Figure 6:
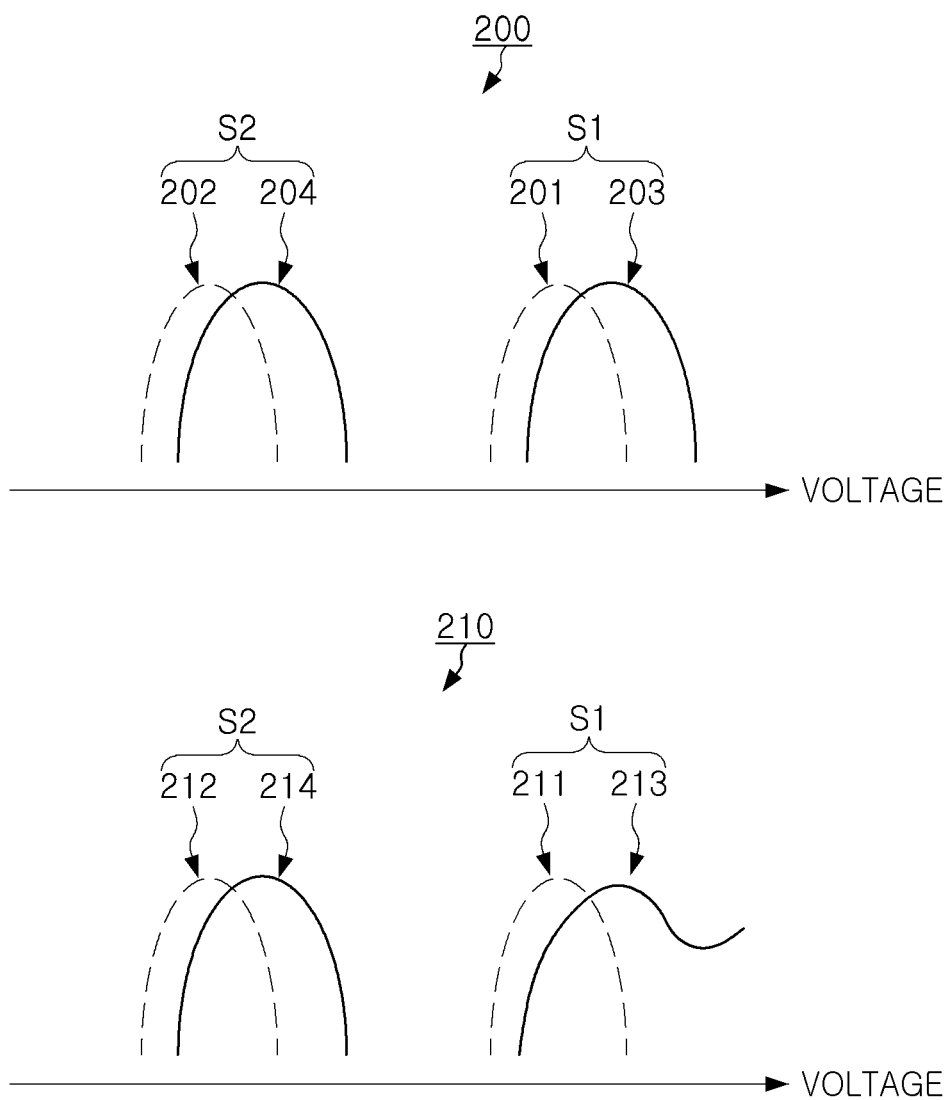
FIGS. 6 and 7 are diagrams illustrating a distribution of threshold voltages of memory cells in a memory device according to an example embodiment of the present disclosure.
Figure 7:
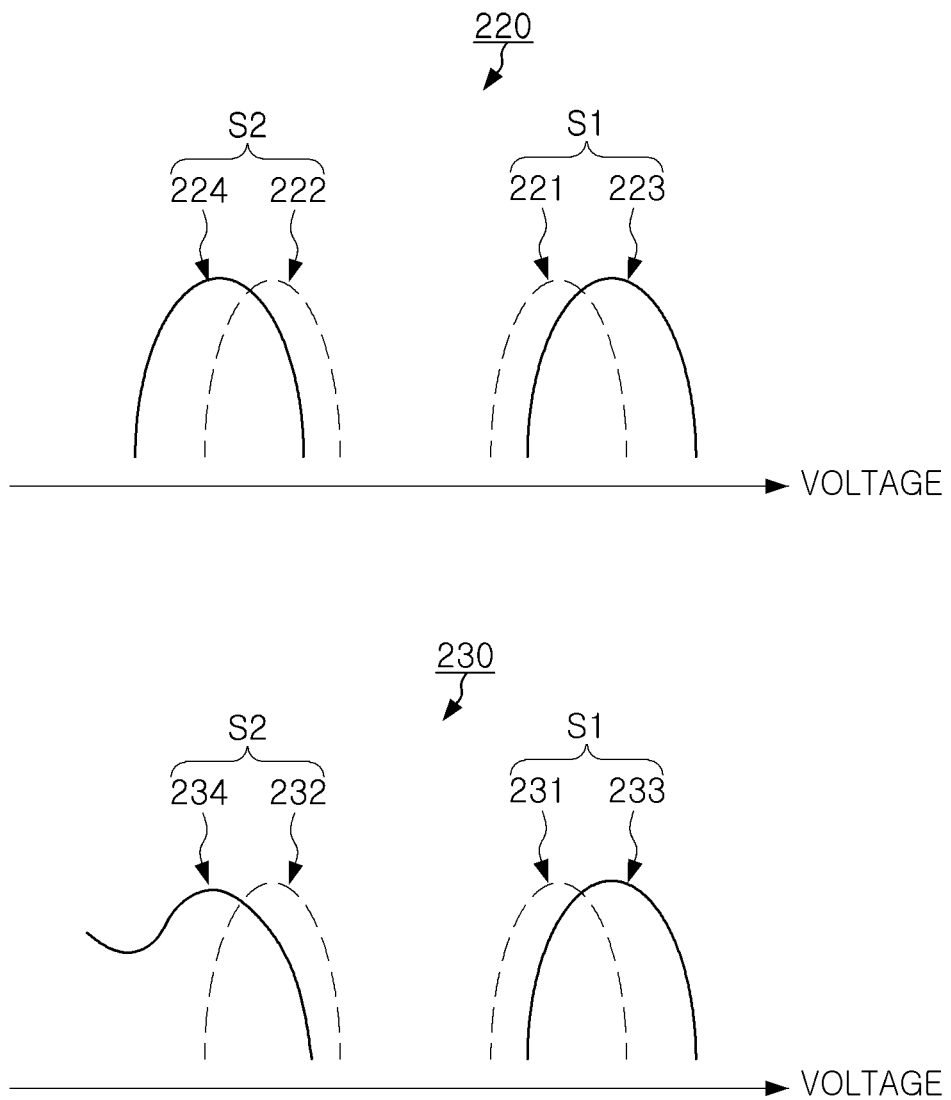

FIGS. 6 and 7 are diagrams illustrating a distribution of threshold voltages of memory cells in a memory device according to an example embodiment.

Referring to a first graph 200 and a second graph 210 of FIG. 6, the memory cells may have a first state S1 and a second state S2. As an example, the memory cells in the first state S1 may have a threshold voltage in a first voltage range and those in the second state S2 may have a threshold voltage in a second voltage range, lower than the first voltage range. In an example embodiment, the first state S1 is a state in which a phase-change material included in a memory element of the memory cells has an amorphous phase and may be defined as a reset state. In addition, the second state S2 refers to a state in which a phase-changing material included in a memory element of the memory cells has a crystalline phase and may be defined as a set state.

As an example, the memory cells may have the first or second state S1 or S2 by a program operation. The program operation may include a first program operation of setting a phase-change material included in the memory cell as an amorphous phase and a second program operation of setting a phase-change material included in the memory cell as a crystalline phase. The memory cell may be set to be in the first state S1 by the first program operation and may be set to be in the second state S2 by the second program operation.

When a maximum value of a range of threshold voltages of the memory cells in the first state S1 refers to a first threshold voltage, and a minimum value of a range of threshold voltages of the memory cells in the second state S2 refers to a second threshold voltage, the threshold voltages of the memory cells may have a magnitude equal to or lower than the first threshold voltage or equal to or higher than the second threshold voltage by the program operation. As an example, the first threshold voltage may be a maximum value of the threshold voltage, which the memory cells having initiated the first program operation can have, and the second threshold voltage may be a minimum value of the threshold voltage, which the memory cells having initiated the second program operation can have.

Referring to the first graph 200 of FIG. 6, the threshold voltage of the memory cells in the first state S1 may have a first distribution 201 changing to a second distribution 203 as time elapses, while that in the second state S2 may have a first distribution 202 changing to a second distribution 204 as time elapses. A change in the threshold voltage exhibited in the memory cells may be generated by a drift, or the like, occurring in the memory cells.

Referring to the second graph 210 of FIG. 6, the threshold voltage of the memory cells in the first state S1 may have a first distribution 211 changing to a second distribution 213 as time elapses. In the meantime, the threshold voltage of the memory cells in the second state S2 may have a first distribution 212 changing to a second distribution 214 as time elapses. In particular, as the threshold voltage of the memory cell in the first state S1 is changed to the second distribution 213, at least one of the memory cells in the first state S1 may have a problem in that a threshold voltage may increase beyond a sensible or desired range in the memory controller.

To solve such a problem, an example embodiment of the present disclosure involves executing a verification operation for the memory cells having the first state S1 in response to a command delivered from outside (e.g., from a device external to the memory array) at one or more or every predetermined period of time (e.g., in a periodic or aperiodic manner). As an example, the verification operation may be executed by inputting or applying a read voltage equal to or higher than a threshold voltage generally exhibited in the memory cells having the first state S1 into the memory cells having the first state S1. For memory cells having the first state S1 that are not turned on during the verification operation, a refresh operation including reprogramming into the first state S1 and/or a repair operation may be executed.

Referring to a first graph 220 and a second graph 230 of FIG. 7, the memory cells may have a first state S1 and a second state S2. The first state S1 and the second state S1 and S2 may be understood based on the example embodiment described with reference to FIG. 6.

Referring to the first graph 220 of FIG. 7, the threshold voltage of the memory cells in the first state S1 may have a first distribution 221 changing to a second distribution 223 as time elapses, while that in the second state S2 may have a first distribution 222 to a second distribution 224 as time elapses. In the first graph 220 of FIG. 7, a change in the threshold voltage exhibited in the memory cells in the second state S2 may be generated by a controlled operation continuously executed, for example, a program operation, a read operation, or the like.

Referring to the second graph 230 of FIG. 7, the threshold voltage of the memory cells in the first state S1 may have a first distribution 231 changing to a second distribution 233 as a time elapses. In the meantime, the threshold voltage of the memory cells in the second state S2 may have a first distribution 232 changing to a second distribution 234 as time elapses. As the threshold voltage of the memory cell in the second state S2 is changed to the second distribution 234, at least one of the memory cells in the second state S2 may have a problem in that a threshold voltage may be reduced below a sensible or desired range in the memory controller.

To solve such a problem, an example embodiment of the present disclosure involves executing a verification operation on the memory cells in the second state S2 in response to a command delivered from outside (e.g., from an external device) at one or more or every predetermined period of time (e.g., in a periodic or aperiodic manner). As an example, the verification operation may be executed by inputting or applying a read voltage equal to or lower than a threshold voltage generally exhibited in memory cells in the second state S2 into the memory cells in the second state S2. For memory cells in the second state S2 that have been turned on during the verification operation, a repair operation involving replacing with redundant memory cells, and/or a refresh operation involving reprogramming into the second state S2 may be executed. In some embodiments, replacing memory cells with redundant memory cells may include altering one or more addressing operations.

Figure 8A:
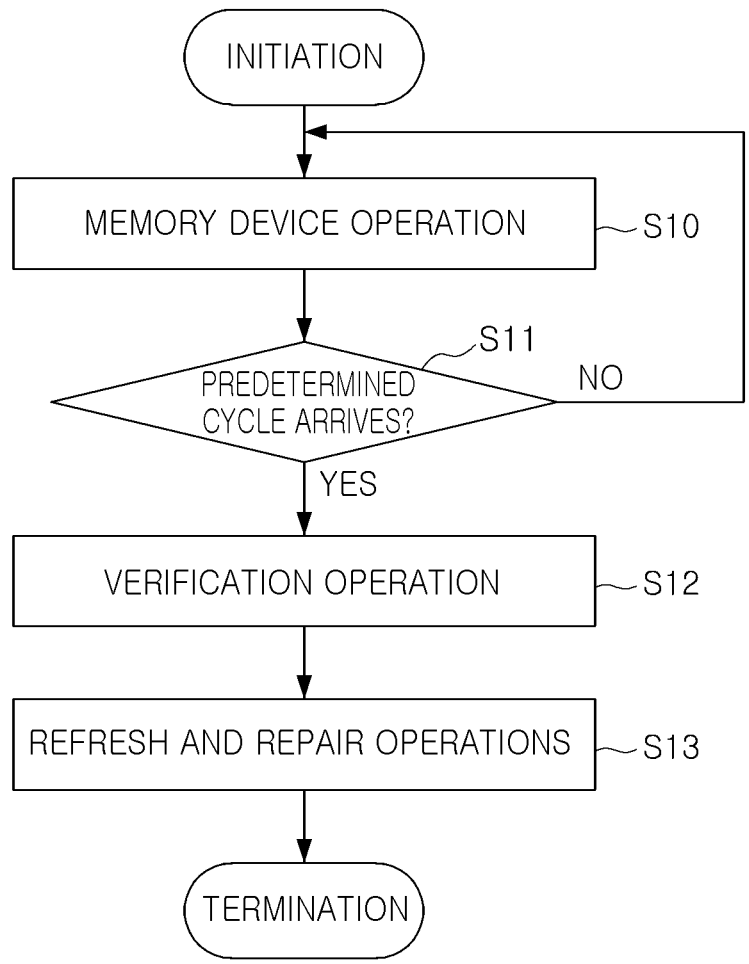
FIG. 8A is a flow chart provided to describe an operation of a memory device and FIG. 8B is a diagram illustrating a distribution of threshold voltages of memory cells in a memory device according to an example embodiment of the present disclosure.

FIG. 8A is a flow chart provided to describe an operation of a memory device according to an example embodiment.

Referring to FIG. 8A, a memory device may initiate an operation (S10). As an example, the memory device may be connected to an external device or host, such as an application processor, a central processing unit, a system-on-chip, or the like, to initiate the operation and may execute in response to a command delivered by the external host.

While the memory device is executing the operation, a memory controller can determine whether a predetermined cycle arrives (S11). The cycle may be a period of time pre-saved in the memory device. Alternatively, the memory controller counts a number of at least one of the program operation or the read operation executed and determines that the cycle has arrived when the counted number reaches a predetermined reference number. In S11, the memory device may continue operation (S10) when it is determined that the cycle has not yet come.

During S11, when determined that the cycle has arrived, the memory controller may execute a verification operation (S12). The verification operation executed in S12 may be similar to the read operation. For example, the memory controller may input or apply a first read voltage, higher than a read voltage input during a general read operation into at least one target memory cell, among the memory cells, and identify or determine that a target memory cell, which has not been turned on by the first read voltage and maintains a turned-off state, as a first defect or defective memory cell. Further, the memory controller input or apply a second read voltage, lower than a general read voltage into at least one target memory cell and identify or determine that a target memory cell, which has been turned on by the second read voltage, as a second defect or defective memory cell.

The memory controller may execute a refresh operation, a repair operation, or the like, on the first defect memory cell and the second defect memory cell (S13). Hereinbelow, the verification operation will be described in more detail with reference to FIG. 8B.

Figure 8B:
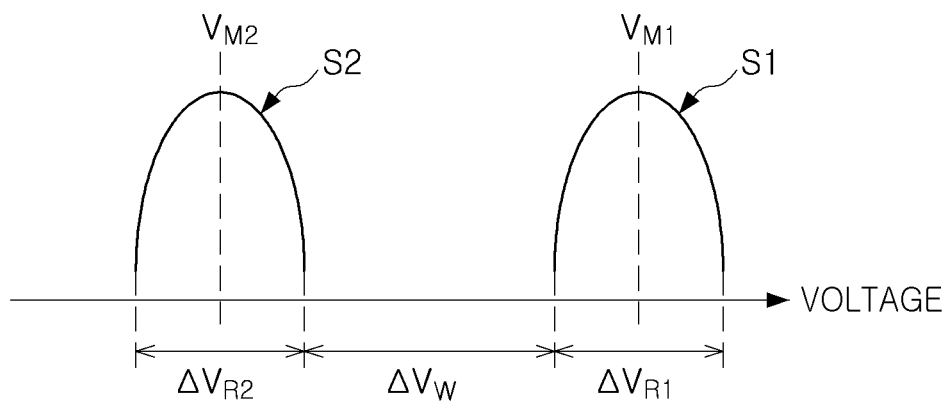

FIG. 8B is a diagram illustrating an example distribution of threshold voltages of the memory cells. Referring to FIG. 8B, the memory cells may have a first state S1 and a second state S2. The memory cells in the first state S1 may have a threshold voltage in a first voltage range $\Delta V_{R1}$ while those in the second state S2 may have a threshold voltage in a second voltage range $\Delta V_{R2}$.

The verification operation may be similar to the read operation, but may have a different voltage input into or applied to the memory cells by the memory controller. As an example, a read voltage having a magnitude included in a voltage window $\Delta V_W$ may be input into or applied to the selected memory cell during the read operation. The memory controller may determine that the selected memory cell, which has not been turned on by the read voltage, is in the first state S1, and which has been turned on by the read voltage, is in the second state S2.

A read voltage having a magnitude outside the voltage window $\Delta V_W$ may be input or applied during the verification operation. As an example, the memory controller may input or apply the first read voltage higher than the voltage window $\Delta V_W$ into a target memory cell of the verification operation. In an example embodiment, the first read voltage may be higher than a median value $V_{M1}$ of the first voltage range $\Delta V_{R1}$. When the target memory cell is not turned on by the first read voltage, the memory controller may reprogram the target memory cell to be in the first state S1.

In an example embodiment, the first read voltage may be lower than a maximum read voltage that can be input or applied to the memory cells by the memory controller, and may be at least 0.8 times the maximum read voltage. The maximum read voltage may be higher than a maximum value of the first voltage range $\Delta V_{R1}$. Depending on example embodiments, the first read voltage may be a voltage higher than the maximum value of the first voltage range $\Delta V_{R1}$.

During the verification operation, the memory controller may input a second read voltage lower than the voltage window $\Delta V_W$ into a target memory cell of the verification operation. As an example, the second read voltage may be lower than a median value $V_{M2}$ of the second voltage range $\Delta V_{R2}$. Depending on example embodiments, the second read voltage may be a voltage lower than a minimum value of the second voltage range $\Delta V_{R2}$. When the target memory cell is turned on by the second read voltage, the memory controller may execute a repair operation involving replacing the target memory cell with a redundant memory cell.

In an example embodiment, the second read voltage may be higher than a minimum read voltage that can be input or applied to the memory cells, and may be equal to or less than 1.2 times the minimum read voltage. The minimum read voltage may be lower than the minimum value of the second voltage range $\Delta V_{R2}$.

Figure 9:
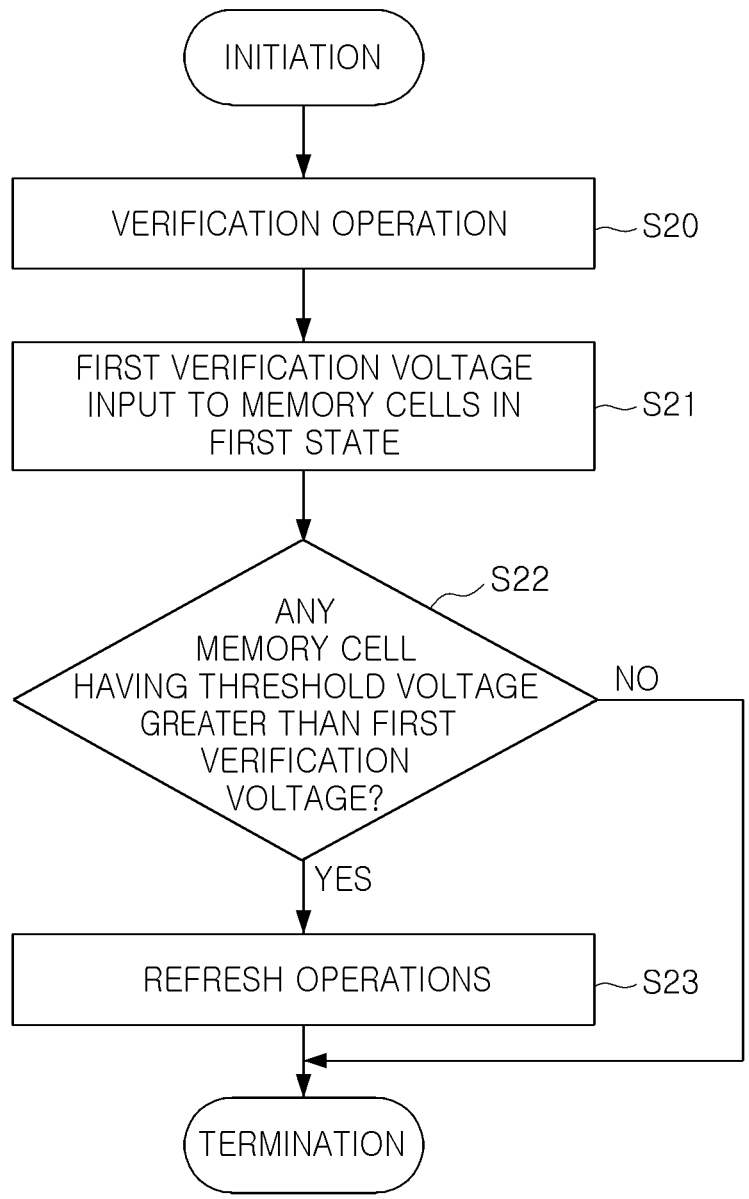
FIGS. 9 and 10 are diagrams provided to describe an operation of a memory device according to an example embodiment of the present disclosure.
Figure 10:
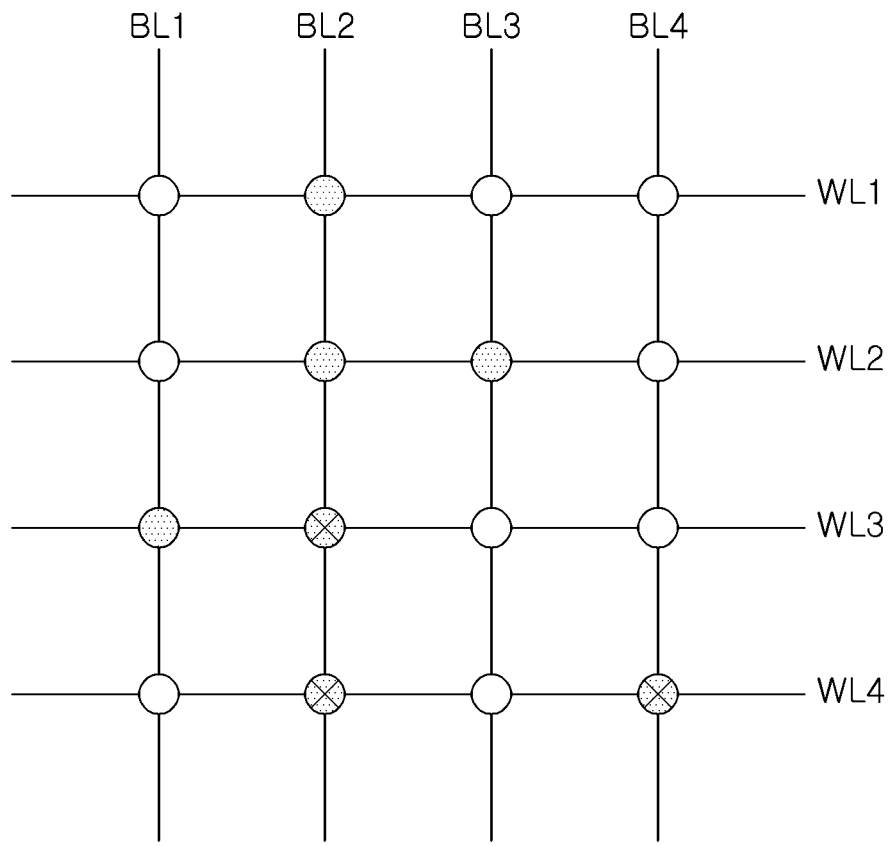

FIGS. 9 and 10 are diagrams provided to describe an operation of a memory device according to an example embodiment.

Referring to FIG. 9, a memory device in an example embodiment of the present disclosure may initiate a verification operation (S20). The verification operation may be initiated when a cycle elapses at a predetermined time and/or a number of program operations, read operations, or the like, executed in a memory device reaches a predetermined number. That is, the verification operation may be performed responsive to predetermined cycles, which may include predetermined time(s) and/or predetermined number(s) of control operations (e.g., read and/or program operations).

Once the verification operation is initiated (S20), a memory controller of the memory device may input or apply a first verification voltage into memory cells in the first state (S21). As previously described, the first state may be a state in which a memory element of the memory cells has an amorphous phase. The first verification voltage may be voltage applied or input into the memory cells in the first state through word lines and bit lines connected to the memory cells in the first state. The memory controller may determine whether, among the memory cells in the first state, there is a memory cell having a threshold voltage higher than the first verification voltage (S22). As an example, the memory controller may determine during S22 whether there is a memory cell which is not turned on by the first verification voltage. Accordingly, the verification operation may be understood as a read operation using the first verification voltage as a read voltage.

During S22, when it is determined there is no memory cell having a threshold voltage higher than the first verification voltage, the memory controller may terminate the verification operation. Meanwhile, when it is determined there is a memory cell having a threshold voltage higher than the first verification voltage, the memory controller may execute a refresh operation on the memory cell (S23). As an example, the refresh operation may be an operation of reprogramming the memory cell to be in the first state.

Referring to FIG. 10, the memory cells may include first memory cells MC1 in the first state and second memory cells MC2 in the second state, which are connected to bit lines BL1 to BL4 and word lines WL1 to WL4. Threshold voltages of the first memory cells MC1 may be higher than those of the second memory cells MC2.

In an example embodiment described with reference to FIG. 9, the first verification voltage can be applied or input into the first memory cells MC1 only. The memory controller may determine that, among the memory cells MC1, the memory cells that are not turned on by the first verification voltage are first defect memory cells FMC1. The memory controller may execute the refresh operation on the first defect memory cells FMC1.

Figure 11:
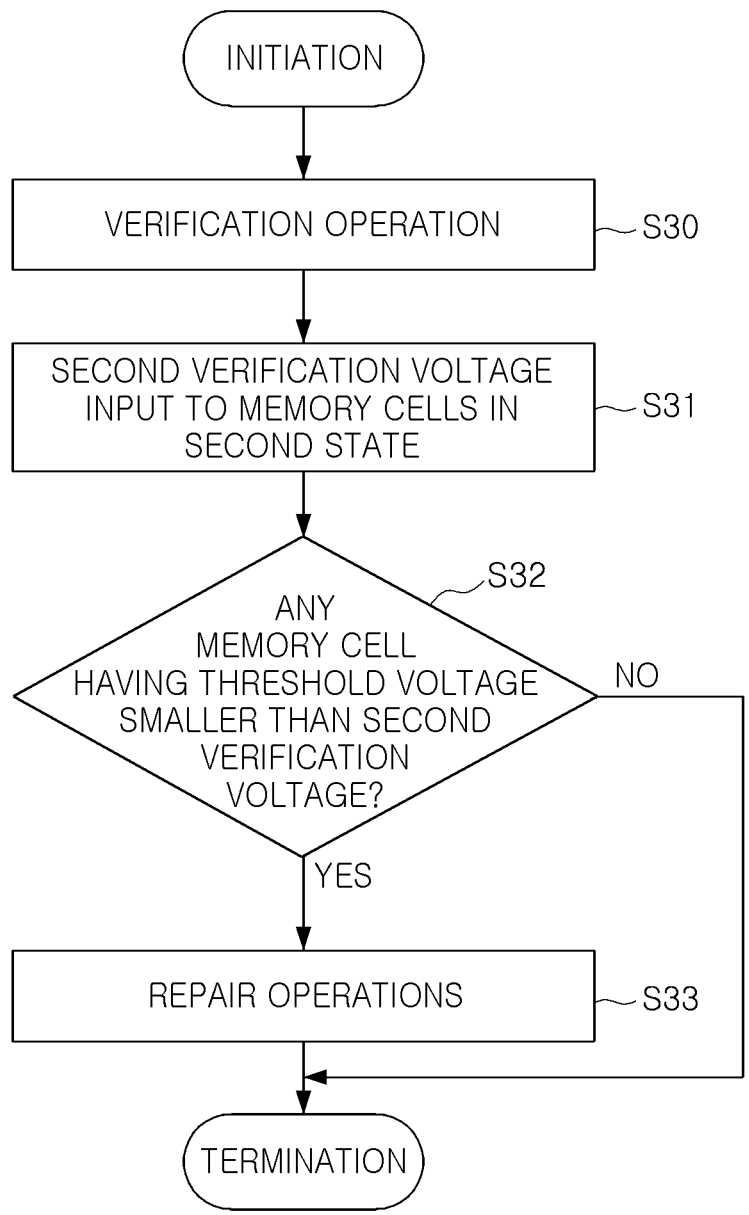
FIGS. 11 and 12 are diagrams provided to describe an operation of a memory device according to an example embodiment of the present disclosure.
Figure 12:
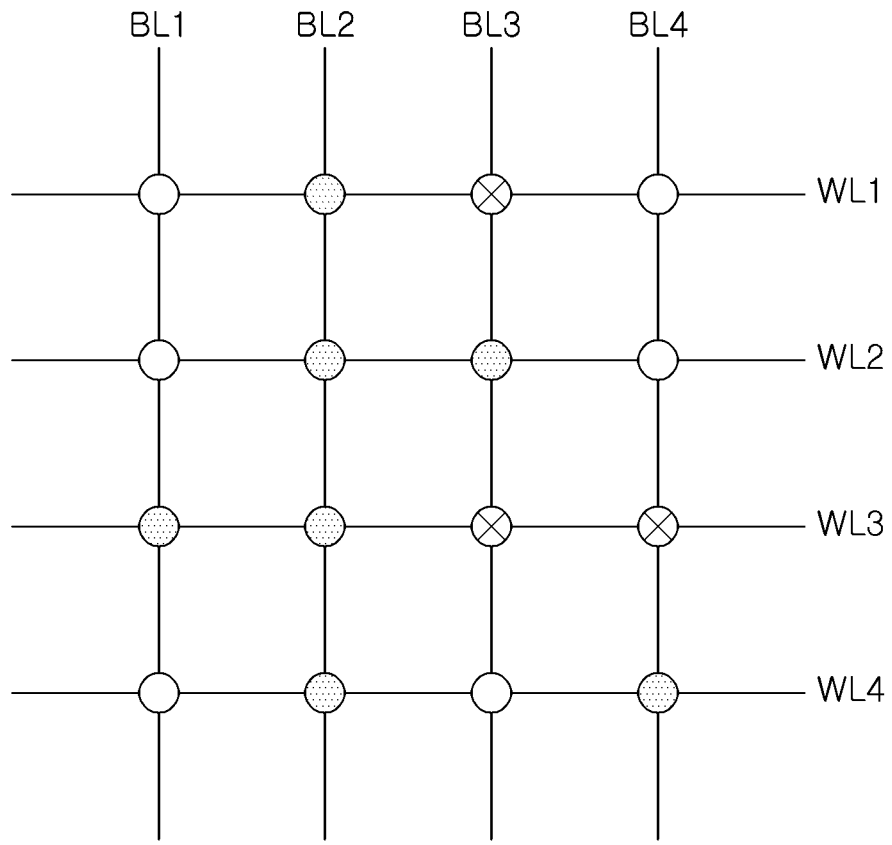

FIGS. 11 and 12 are diagrams provided to describe an operation of a memory device according to an example embodiment.

Referring to FIG. 11, a memory device in an example embodiment may initiate a verification operation (S30). The verification operation may be initiated when a cycle based on a predetermined time has elapsed or the number of program operations, read operations, or the like, executed in the memory device reaches a predetermined number (i.e., at predetermined times and/or after a predetermined number of operations).

Once the verification operation is initiated, a memory controller of the memory device may apply or input a second verification voltage into memory cells having the second state (S31). As previously described, the second state may be a state in which a memory element of the memory cells has a crystalline phase. The second verification voltage may be voltage applied or input into the memory cells in the second state through word lines and bit lines connected to the memory cells in the second state. The memory controller may determine whether, among the memory cells in the second state, there is a memory cell having a threshold voltage lower than the second verification voltage (S32). As an example, the memory controller may determine in S32 whether there is a memory cell which is turned on by the second verification voltage. Accordingly, the verification operation may be understood as a read operation using the second verification voltage as a read voltage.

In S32, when it is determined there is no memory cell having a threshold voltage lower than the second verification voltage, the memory controller may terminate the verification operation. Meanwhile, when it is determined there is a memory cell having a threshold voltage lower than the second verification voltage, the memory controller may execute a repair operation on the memory cell (S33). As an example, the repair operation may be an operation of replacing the memory cell with a redundant memory cell.

Referring to FIG. 12, the memory cells may include first memory cells MC1 in the first state and second memory cells MC2 in the second state, which are connected to bit lines BL1 to BL4 and word lines WL1 to WL4. Threshold voltages of the first memory cells MC1 may be higher than those of the second memory cells MC2.

In an example embodiment described with reference to FIG. 11, the second verification voltage can be applied or input into the second memory cells MC2 only. The memory controller may determine that, among the memory cells MC2, the memory cells that are turned on by the second verification voltage are second defect memory cells FMC2. The memory controller may execute the repair operation on the second defect memory cells FMC2.

Figure 13:
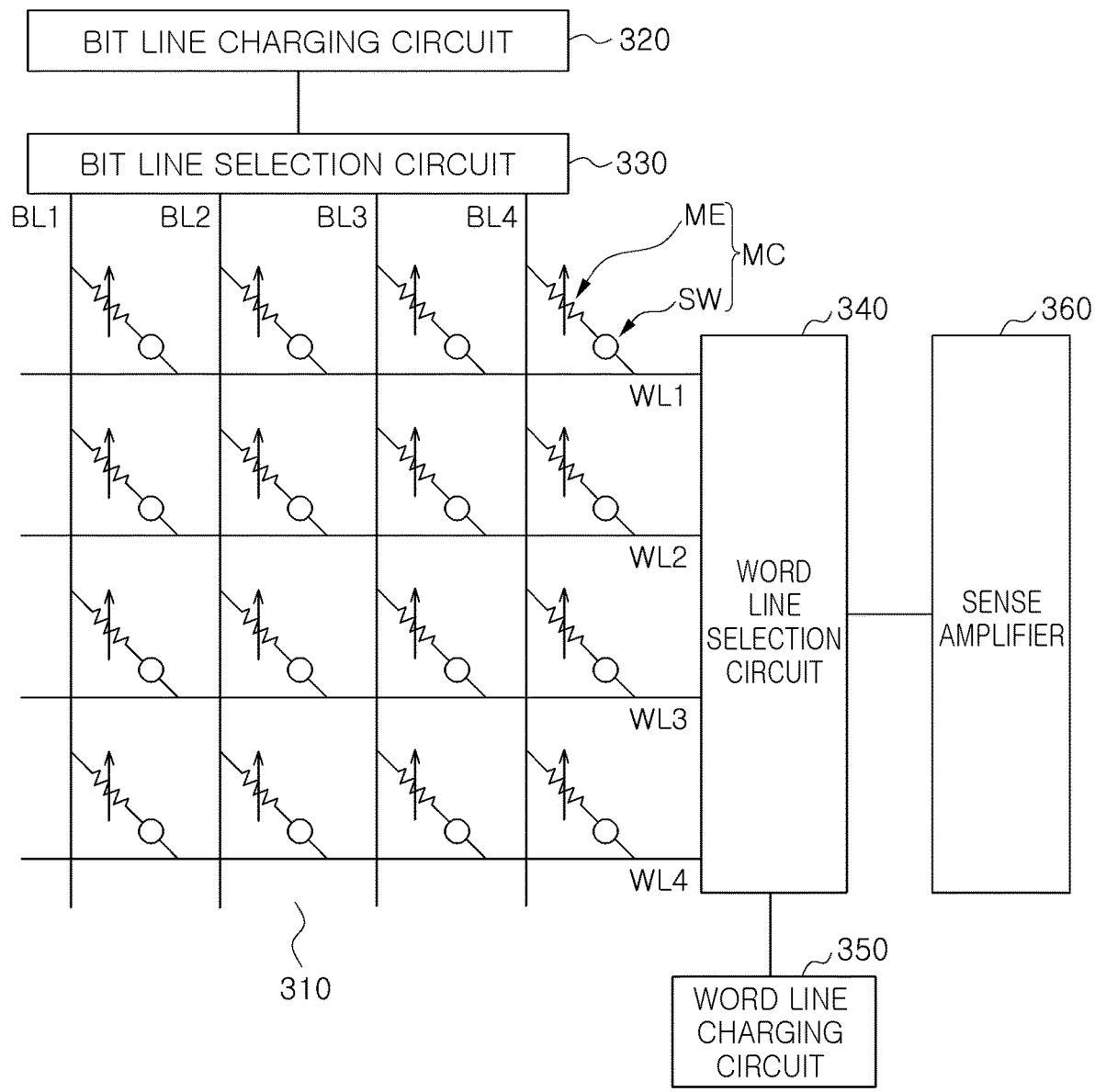
FIGS. 13 to 14 are diagrams illustrating a memory device according to an example embodiment of the present disclosure.
Figure 14:
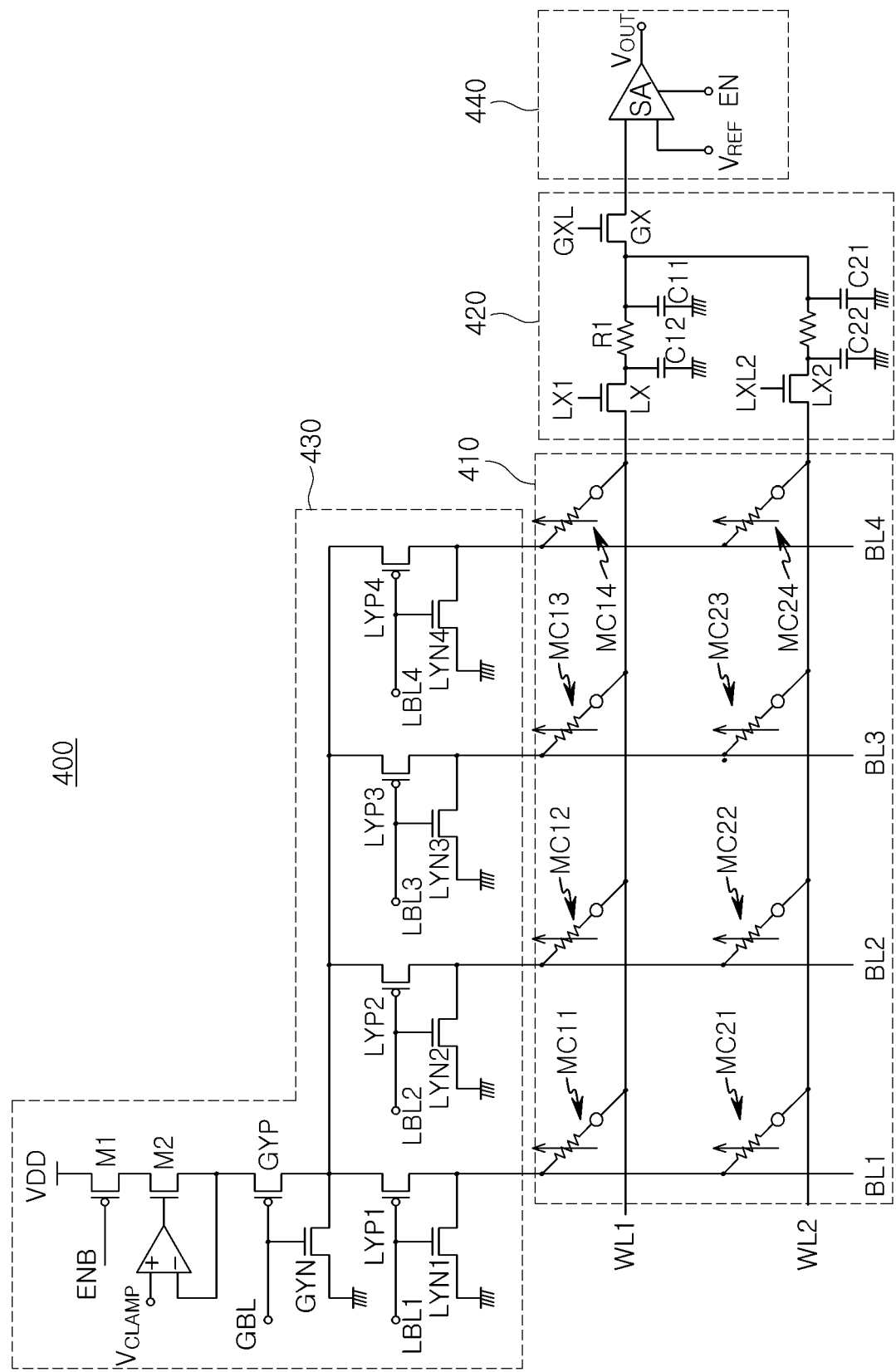

FIGS. 13 to 14 are diagrams illustrating a memory device according to an example embodiment.

Referring to FIG. 13, a memory device 300 according to an example embodiment may include a memory cell array 310, a bit line charging circuit 320, a bit line selection circuit 330, a word line selection circuit 340, a word line charging circuit 350, a sense amplifier 360, or the like. The memory cell array includes memory cells MC, and each of the memory cells MC may include a switch element SW and a memory element ME. The memory cells MC may be connected to bit lines BL1 to BL4 and word lines WL1 to WL4.

The bit line charging circuit 320 may be connected to the bit lines BL1 to BL4 through the bit line selection circuit 330. The bit line selection circuit 330 may determine a selected bit line and an unselected bit line among the bit lines BL1 to BL4. In the controlled operation of a program operation, a read operation, or the like, different voltages may be applied or input into the selected bit line and the unselected bit line. The voltage applied or input into the selected bit line and the unselected bit line may be determined by the bit line charging circuit 320 and the bit line selection circuit 330.

The word line charging circuit 350 may be connected to the word lines WL1 to WL4 through the sense amplifier 360 and the word line selection circuit 340. The word line selection circuit 340 may determine a selected word line and an unselected word line among the word lines WL1 to WL4. In the controlled operation of a program operation, a read operation, or the like, different voltages may be applied or input into the selected word line and the unselected word line. The voltage applied or input into the selected word line and the unselected word line may be determined by the word line charging circuit 350 and the word line selection circuit 340.

The memory device 300 according to an example embodiment may execute a read operation and a verification operation. The verification operation involves applying or inputting a voltage different from that of a general read operation into the memory cells MC and determining threshold voltages of the memory cells MC, and may be executed in a similar manner to the read operation.

Referring to FIG. 14, a memory device 400 according to an example embodiment may include a memory cell array 410, a first decoder circuit 420, a second decoder circuit 430, a sense amplifier 440, or the like. Only two word lines WL1 and WL2 and four bit lines BL1 to BL4 are illustrated in an example embodiment of FIG. 14, but numbers thereof may vary (e.g., fewer or more word lines and bit lines may be included). The memory cell array 410 may include memory cells MC11 to MC14 and MC21 to MC24 connected to the word lines WL1 and WL2 and the bit lines BL1 to BL4.

The first decoder circuit 420 is connected to the word lines WL1 and WL2 and selects one of the word lines WL1 and WL2 as a selected word line for a read operation and inputs or applies a word line voltage to the selected word line. As an example, the voltage may be a negative voltage. As an example, a circuit for inputting or applying the word line voltage may be connected between a second switch element GX and the sense amplifier 440.

The word lines WL1 and WL2 may be connected to at least one switch element included in the first decoder circuit 420. As an example, the first word line WL1 may be connected to the sense amplifier 440 through a first switch element LX and the second switch element GX. The second word line WL2 may be connected to the sense amplifier 440 through a first switch element LX2 and the second switch element GX.

In an example embodiment illustrated in FIG. 14, the first word line WL1 and the second word line WL2 may share one second switch element GX and one sense amplifier 440. Depending on example embodiments, however, the first word line WL1 and the second word line WL2 may be connected to different second switch elements GX and sense amplifiers 440.

Based on the second decoder circuit 430, each of the bit lines BL1 to BL4 may be connected to a pair of switch elements. As an example, the first bit line BL1 may be connected to a first selection switch element LYP1 and a first unselected switch element LYN1. The first selection switch element LYP1 is turned on when the first bit line BL1 is determined as a selected bit line, while the first unselected switch element LYN1 is turned on when the first bit line BL1 is determined as an unselected bit line. As an example, the first selected switch element LYP1 may be a PMOS transistor and the first unselected switch element LYN1 may be an NMOS transistor. Gate terminals of the first selected switch element LYP1 and the first unselected switch element LYN1 may be commonly input with a first bit line control signal LBL1.

Meanwhile, the bit lines BL1 to BL4 may share one common selected switch element GYP and one common unselected switch element GYN. The common selected switch element GYP may be a PMOS transistor, and the common unselected switch element GYN may be an NMOS transistor. Gate terminals of the common selected switch element GYP and the common unselected switch element GYN may be commonly input with a bit line control signal GBL.

The sense amplifier 440 may include an operational amplifier SA, and a first input terminal of the operational amplifier SA is connected to the word lines WL1 and WL2, and a second input terminal is connected to a reference voltage $V_{REF}$. The sense amplifier 440 may output an output voltage $V_{OUT}$ corresponding to a result of comparing a voltage of the first input terminal and reference voltage $V_{REF}$.

Hereinbelow, an example read operation on the selected memory cell MC11 executed when the first word line WL1 and the first bit line BL1 are respectively determined as a selected word line and a selected bit line will be described in detail with reference to FIGS. 15 and 16.

Figure 15:
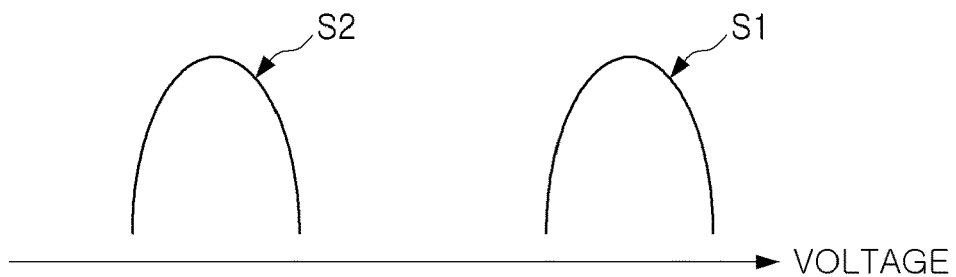
FIGS. 15 and 16 are diagrams provided to describe an operation of a memory device according to an example embodiment of the present disclosure.
Figure 16:
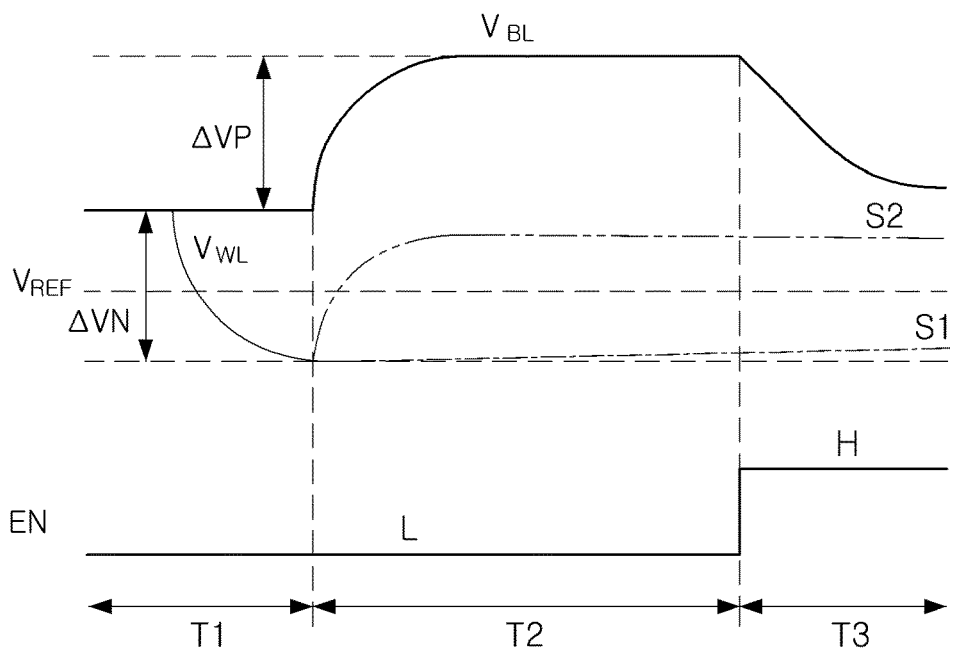

FIGS. 15 and 16 are diagrams provided to describe an operation of a memory device according to an example embodiment.

Referring to FIG. 15, the selected memory cell MC11 may be in a first state S1 and a second state S2. The first state S1 is a state in which a memory element has an amorphous phase, and the second state S2 is a state in which a memory element has a crystalline phase.

Once the read operation is initiated on the selected memory cell MC11, the first decoder circuit 420 turns on a first switch element LX and a second switch element GX, connected to the first word line WL1, during a first time T1 such that a word line voltage $V_{WL}$ can be applied or input into the first word line WL1. Referring to FIG. 16, the word line voltage applied or input $V_{WL}$ into the first word line WL1 may be a negative voltage. Meanwhile, the first switch element LX2 connected to the second word line WL2 may be turned off during the first time T1.

When the first word line WL1 is free-charged by the word line voltages $V_{WL}$, the second decoder circuit 430 may turn on a clamp element M2 and an enable element M1 using an enable signal ENB and a clamp voltage $V_{CLAMP}$ during a second time T2. Further, the second decoder circuit 430 may turn on a common selected switch element shared by the bit lines BL1 to BL4 and turn off a common unselected switch element GYN, while turning on the first selected switch element LYP1 connected to the first bit line BL1 and turning off the first unselected switch element LYN1. The second decoder circuit 430 may turn on unselected switch elements LYN2 to LYN4 shared by the second to fourth bit lines BL2 to BL4 and turn off selected switch elements LYP2 to LYP4. Accordingly, the first bit line BL1 may be input with a bit line voltage $V_{BL}$ while the second to fourth bit lines BL2 to BL4 may be input with a ground voltage. The first decoder circuit 420 may turn off the first switch element LX for the second time T2 to float the first word line WL1.

In the example embodiment described with reference to FIGS. 15 and 16, a voltage difference ($\Delta VP+\Delta VN$) between the first bit line BL1 and the first word line WL1 may be defined by a read voltage $V_{RD}$ input into the selected memory cell MC11. The read voltage $V_{RD}$ may determine whether the selected memory cell MC11 is turned on. As an example, when the selected memory cell MC11 is in the first state S1, a threshold voltage of the selected memory cell MC11 may be higher than the read voltage $V_{RD}$. Accordingly, the selected memory cell MC11 is not turned on, and the word line voltage $V_{WL}$ input into the operational amplifier SA may be maintained to be lower than the reference voltage $V_{REF}$. In contrast, when the selected memory cell MC11 is in the second state S2, the selected memory cell MC11 is turned on, and the word line voltage $V_{WL}$ may become higher than the reference voltage $V_{REF}$ due to a current flowing through the selected memory cell MC11. When the operational amplifier SA is activated by an activation signal EN for a third time T3, data of the selected memory cell MC11 may be detected based on an output signal $V_{OUT}$.

In the read operation according to the example embodiment described with reference to FIGS. 15 and 16, the read voltage $V_{RD}$ may be included in the voltage window $\Delta V_W$ between the threshold voltages of the first state S1 and the second state S2. Further in an example embodiment of the present disclosure, a voltage excluded from the voltage window $\Delta V_W$ is input into the memory cells MC11 to MC14 and MC21 to MC24 to execute a verification operation involving whether the memory cells MC11 to MC14 and MC21 to MC24 are defective.

FIGS. 17 to 20 are diagrams provided to describe an operation of a memory device according to an example embodiment.

Figure 17:
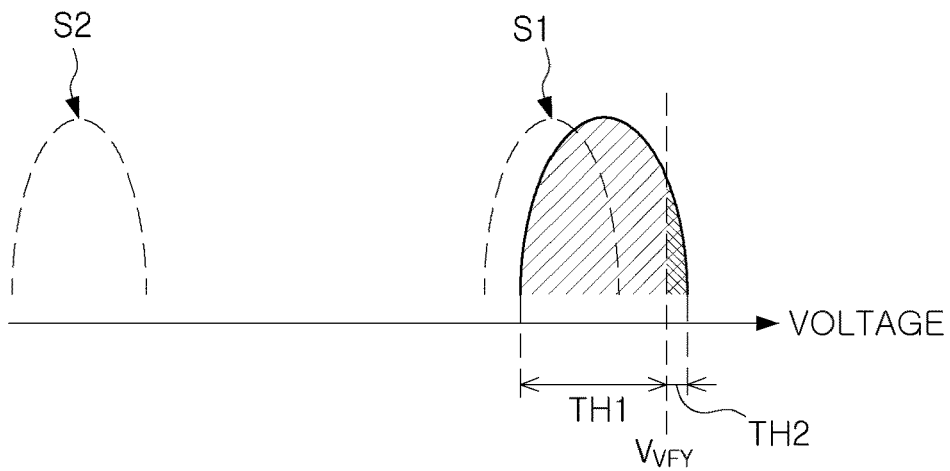
FIGS. 17 to 20 are diagrams provided to describe an operation of a memory device according to an example embodiment of the present disclosure.

Referring to FIG. 17, each memory cell may have a first state S1 or a second state S2. The first state S1 is a state in which a memory element has an amorphous phase, and the second state S2 is a state in which a memory element has a crystalline phase. As time elapses, a threshold voltage of the memory cells in the first state S1 may vary. As an example, the threshold voltage of the memory cells in the first state S1 may be increased by drift, or other factors.

The memory device may execute a verification operation at a predetermined cycle. Once the verification operation is initiated, a word line is charged by the word line voltage $V_{WL}$ during the first time T1, and a bit line is charged by the bit line voltage $V_{BL}$ during the second time T2. The word line voltage $V_{WL}$ and the bit line voltage $V_{BL}$ can be respectively applied or input into a word line and a bit line connected to a target memory cell on which the verification operation is to be executed.

As an example, a magnitude $\Delta VP1$ of the bit line voltage $V_{BL}$ input into the bit line connected to the target memory cell may be higher than a magnitude $\Delta VP$ of the bit line voltage $V_{BL}$ described in the read operation described with reference to FIGS. 15 and 16. Accordingly, a verification voltage $V_{VFY}$ applied or input into the target memory cell may be higher than the read voltage $V_{RD}$ of the read operation. In an example embodiment, a magnitude of the verification voltage $V_{VFY}$ may be higher than a median value of a range of threshold voltages of the memory cells in the first state S1. As an example, the range of threshold voltages of the memory cells in the first state S1 may be classified into a first sub range TH1 and a second sub range TH2 based on the verification voltage $V_{VFY}$.

The memory cell having the threshold voltage of the first sub range TH1 may be turned on by the verification voltage $V_{VFY}$. In contrast, the memory cell having the threshold voltage of the second sub range TH2 may not be turned on by the verification voltage $V_{VFY}$. The memory controller of the memory device may execute a refresh operation on the memory cells which are not turned on by the verification voltage $V_{VFY}$. The refresh operation may be an operation of programming the memory cells to be in the first state S1. Accordingly, the threshold voltage of the memory cells which are not turned on by the verification voltage $V_{VFY}$ may be reduced by the refresh operation. As an example, the threshold voltage of the memory cells which are not turned on by the verification voltage $V_{VFY}$ may be lower than the verification voltage $V_{VFY}$ by or responsive to the refresh operation.

During the verification operation, the memory controller can determine whether the threshold voltage of a target memory cell of the verification operation is higher than the verification voltage $V_{VFY}$ by turning on the sense amplifier during the third time T3. As an example, the sense amplifier may compare the word line voltage $V_{WL}$ of the word line connected to the target memory cell with the reference voltage $V_{REF}$ during the third time T3.

Figure 18:
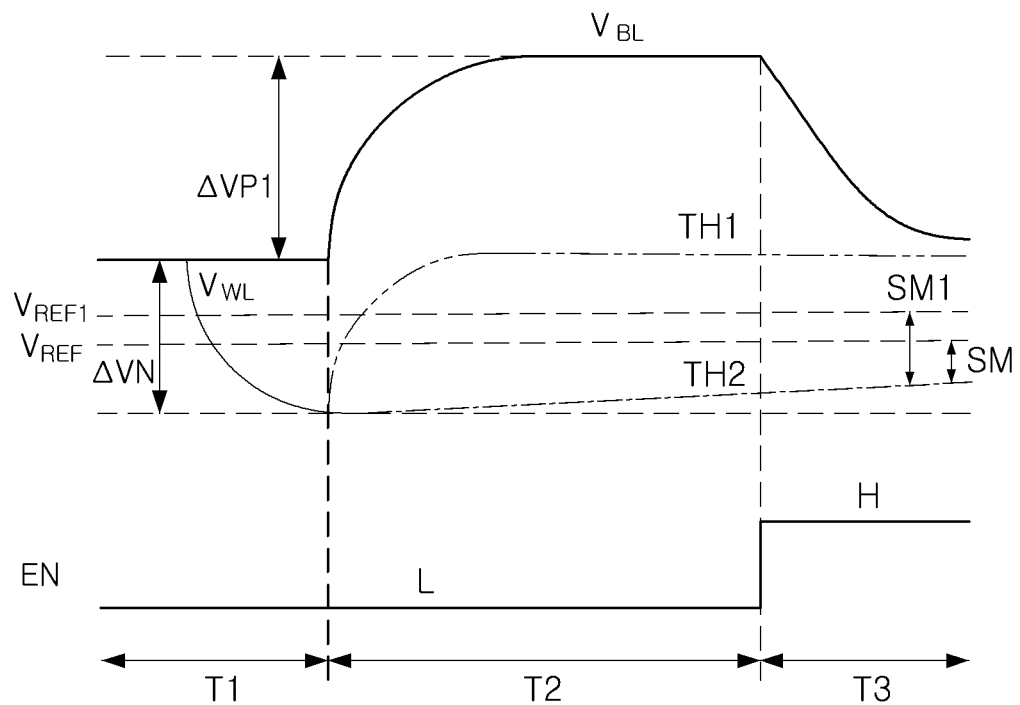

As compared to a general read operation, in the verification operation according to an example embodiment illustrated in FIG. 18, a bit line voltage $V_{BL}$ having an increased magnitude may be used. Accordingly, a sensing margin SM of the target memory cell, which is not turned on by the verification voltage $V_{VFY}$, may be reduced, and accuracy of the verification operation may be reduced. In an example embodiment, the reference voltage $V_{REF}$ is modified to secure the accuracy of the verification operation. As an example, in the verification operation according to an example embodiment illustrated in FIG. 18, a first verification reference voltage $V_{REF1}$ applied or input into the sense amplifier may be higher than the reference voltage $V_{REF}$ input into the sense amplifier during the read operation. Accordingly, a sufficient sensing margin SM1 may be secured on the target memory cell, which is not turned on by the verification voltage $V_{VFY}$.

Figure 19:
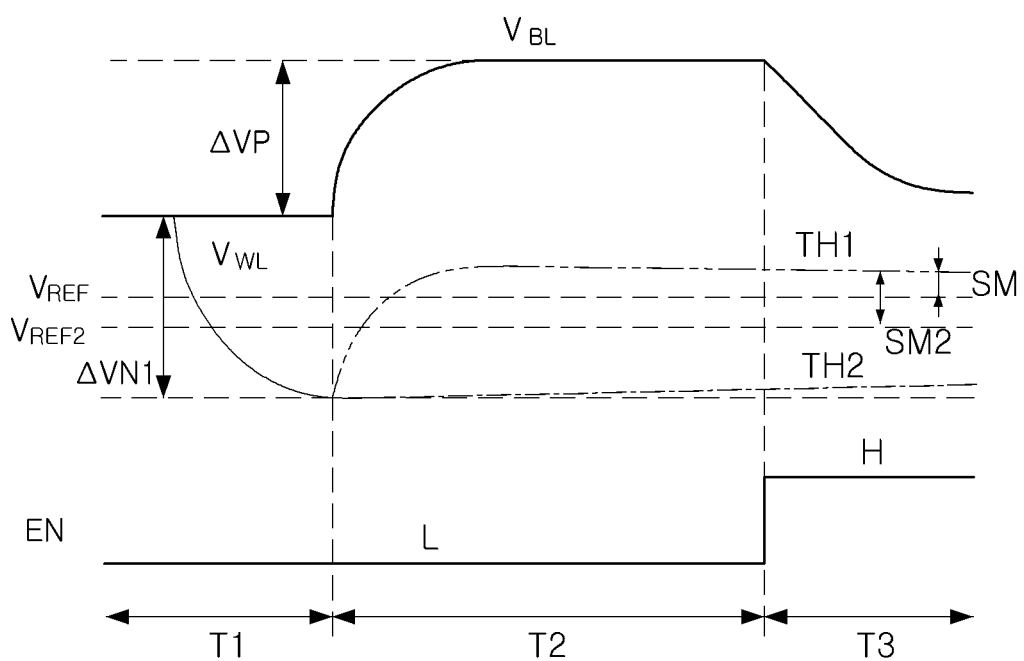

During the verification operation according to an example embodiment illustrated in FIG. 19, a magnitude $\Delta VP$ of the bit line voltage $V_{BL}$ input into the bit line connected to the target memory cell may be substantially identical to a magnitude of a voltage input into the bit line in the general read operation. In contrast, a magnitude $\Delta VN1$ of the word line voltage $V_{WL}$ input into the word line connected to the target memory cell may be higher than a magnitude of a voltage input into the word line in the general read operation. As the word line voltage $V_{WL}$ is a negative voltage, it may be understood that a lower word line voltage $V_{WL}$ is used in the verification operation than in the read operation.

The memory controller of the memory device may execute a refresh operation on the target memory cell, which is not turned on by the verification voltage $V_{VFY}$. As an example, a threshold voltage of the target memory cell, which is not turned on by the verification voltage $V_{VFY}$, may be included in the second sub range TH2.

In an example embodiment illustrated in FIG. 19, as a magnitude $\Delta VN1$ of the word line voltage $V_{WL}$, instead of the bit line voltage $V_{BL}$, is increased to execute the verification operation, the sensing margin SM of the target memory cell having the threshold voltage in the first sub range TH1 may be reduced. The memory controller may reduce the reference voltage $V_{REF}$ input into the sense amplifier to a second verification voltage $V_{REF2}$. Accordingly, a sufficient sensing margin SM2 may be secured on the target memory cell having a threshold voltage in the first sub range TH1.

Figure 20:
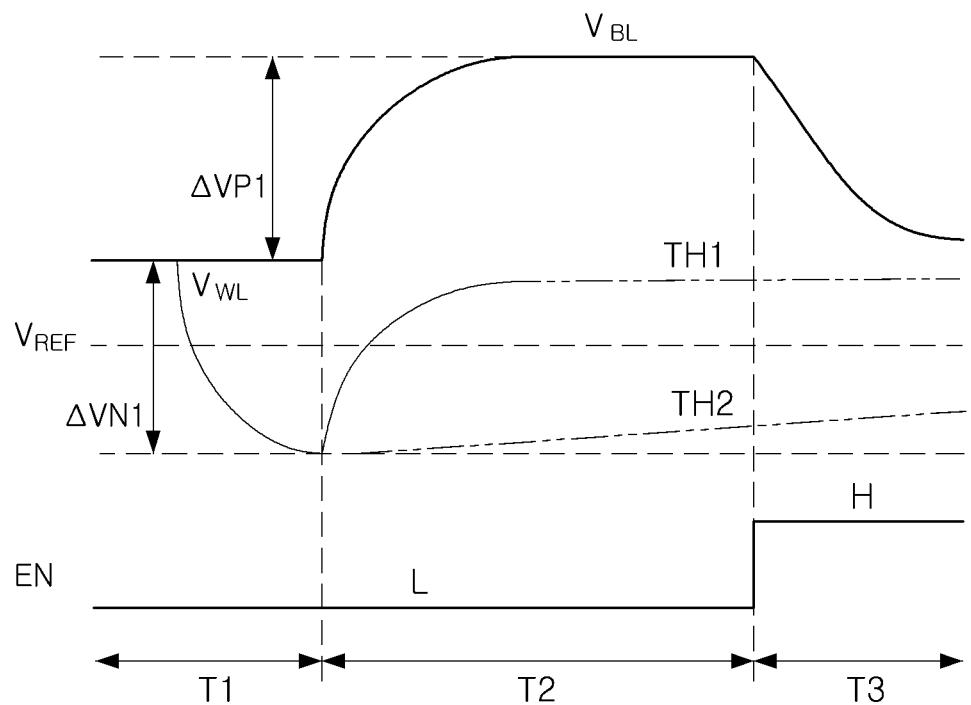

During the verification operation according to an example embodiment illustrated in FIG. 20, both a magnitude $\Delta VP1$ of the bit line voltage $V_{BL}$ and a magnitude $\Delta VN1$ of the word line voltage $V_{WL}$ may increase, as compared to the general read operation. A refresh operation of programming to the first state S1 may be executed on the memory cells having a threshold voltage of the second sub range TH2.

In an example embodiment illustrated in FIG. 20, as a magnitude $\Delta VN1$ of the word line voltage $V_{WL}$ and a magnitude $\Delta VN1$ of the word line voltage $V_{WL}$ increase, a problem of a reduced sensing margin may not arise without controlling the reference voltage $V_{REF}$. If necessary, however, the memory controller may control reference voltage $V_{REF}$ such that a sufficient sensing margin is secured. As an example, as compared to the general read operation, when a degree of a magnitude change of the bit line voltage $V_{BL}$ is higher than that of the word line voltage $V_{WL}$, the reference voltage $V_{REF}$ may be increased. Conversely, as compared to the general read operation, when a degree of a magnitude change of the word line voltage $V_{WL}$ is higher than that of the bit line voltage $V_{BL}$, the reference voltage $V_{REF}$ may be reduced.

In the example embodiments of the present disclosure, a higher verification voltage $V_{VFY}$ compared to a read voltage of the general read operation may be applied or input into a target memory cell by increasing the bit line voltage $V_{BL}$ or decreasing the word line voltage $V_{WL}$ during the verification operation on the memory cells in the first state S1. A reduced word line voltage $V_{WL}$ can be understood as an increased absolute value of the word line voltage $V_{WL}$, which may be a negative voltage. The memory controller may control a reference voltage $V_{REF}$ applied or input into the sense amplifier to sufficiently secure the sensing margin SM. As an example, a magnitude of the increase in the bit line voltage $V_{BL}$ is higher than that of the word line voltage $V_{WL}$, a comparatively large first verification reference voltage $V_{REF1}$ may be applied or input into the sense amplifier. Conversely, when a magnitude of the decrease in the bit line voltage $V_{BL}$ is lower than that of the word line voltage $V_{WL}$, a comparatively lower second verification reference voltage $V_{REF2}$ may be applied or input into the sense amplifier.

FIGS. 21 to 24 are diagrams provided to describe an operation of a memory device according to an example embodiment.

Figure 21:
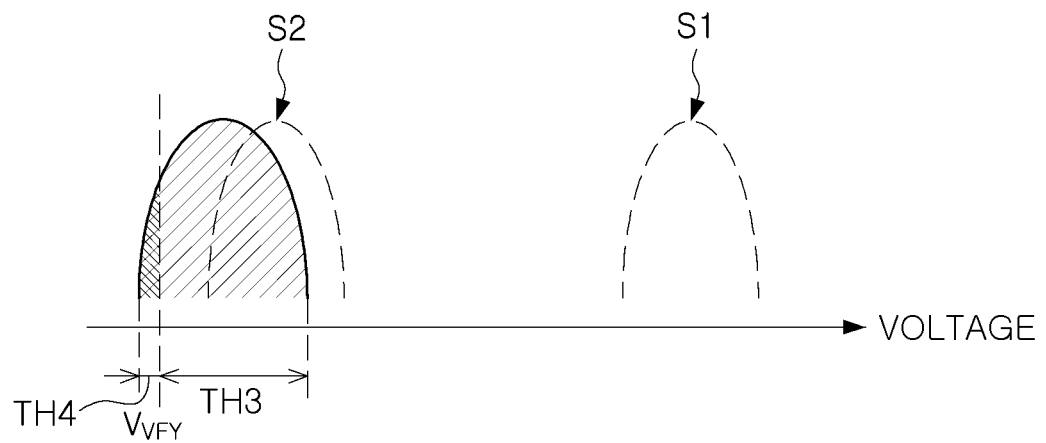
FIGS. 21 to 24 are diagrams provided to describe an operation of a memory device according to an example embodiment of the present disclosure.

Based on FIG. 21, each memory cell may have a first state S1 or a second state S2. The first state S1 is a state in which a memory element has an amorphous phase, and the second state S2 is a state in which a memory element has a crystalline phase. As time elapses, a threshold voltage of the memory cells in the second state S2 may vary. As an example, the threshold voltage of the memory cells in the second state S2 may be reduced as a number of operations on the memory cells is increased.

The memory device may execute a verification operation at a predetermined time or cycle. Once the verification operation is initiated, a word line is charged by the word line voltage $V_{WL}$ during the first time T1, and a bit line is charged by the bit line voltage $V_{BL}$ during the second time T2. The word line voltage $V_{WL}$ and the bit line voltage $V_{BL}$ can be respectively applied or input into a word line and a bit line connected to a target memory cell on which the verification operation is to be executed. The memory controller may activate the sense amplifier and compare the word line voltage $V_{WL}$ with the reference voltage $V_{REF}$ during the third time T3.

In the verification operation, a magnitude of the verification voltage $V_{VFY}$ input into a target cell may be lower than a read voltage input into the memory cell during a general read operation. As an example, the verification voltage $V_{VFY}$ may be included in a range of threshold voltages of the memory cells in the second state S2. The range of threshold voltages of the memory cells in the second state S2 may be classified into a third sub range TH3 and a fourth sub range TH4 based on the verification voltage $V_{VFY}$.

A memory cell having a threshold voltage in the third sub range TH3 may maintain a turned-off state instead of being turned on by the verification voltage $V_{VFY}$. In contrast, a memory cell having a threshold voltage in the fourth sub range TH4 may be turned on by the verification voltage $V_{VFY}$. The memory controller of the memory device may execute a refresh operation or a repair operation on the memory cells turned on by the verification voltage $V_{VFY}$. The repair operation may include an operation of replacing the memory cells turned on by the verification voltage $V_{VFY}$ with redundant memory cells.

During the verification operation, the memory controller may determine whether a threshold voltage of a target memory cell of the verification operation is lower than the verification voltage $V_{VFY}$ by turning on the sense amplifier during the third time T3. As an example, the sense amplifier may compare the word line voltage $V_{WL}$ of the word line connected to the target memory cell with the reference voltage $V_{REF}$ during the third time T3.

Figure 22:
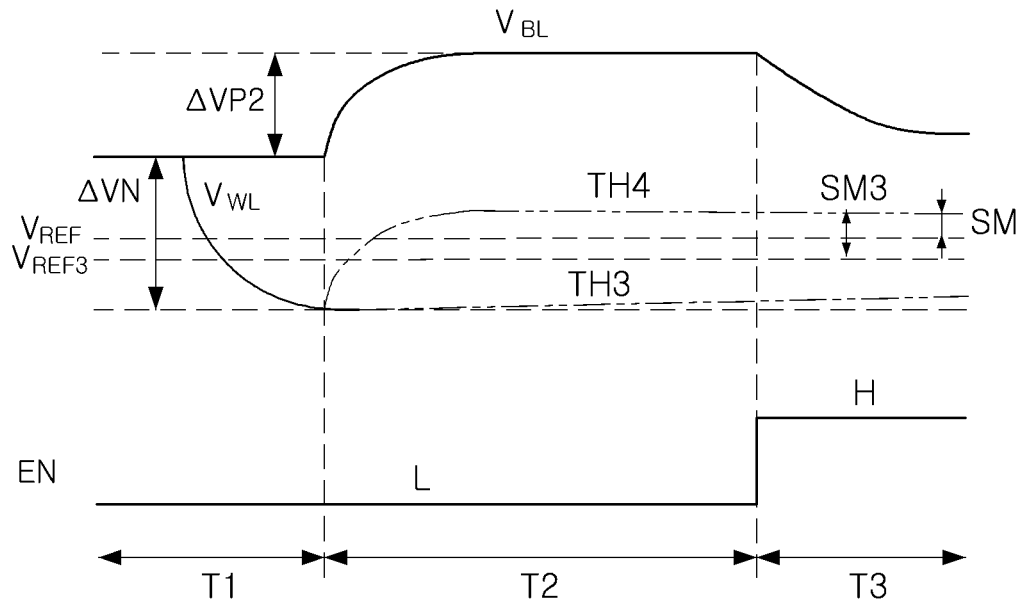

During the verification operation according to an example embodiment illustrated in FIG. 22, a bit line voltage $V_{BL}$ having a reduced magnitude ΔVP2 as compared to that of the general read operation may be used. Accordingly, a sensing margin SM of a target memory cell turned on by the verification voltage $V_{VFY}$ may be reduced, and accuracy of the verification operation may be reduced. In an example embodiment, the verification voltage $V_{VFY}$ is changed to a third verification reference voltage $V_{REF3}$ to secure a sufficient sensing margin SM3. The third verification reference voltage $V_{REF3}$ may be lower than the verification voltage $V_{VFY}$ input into the sense amplifier during the general read operation.

Figure 23:
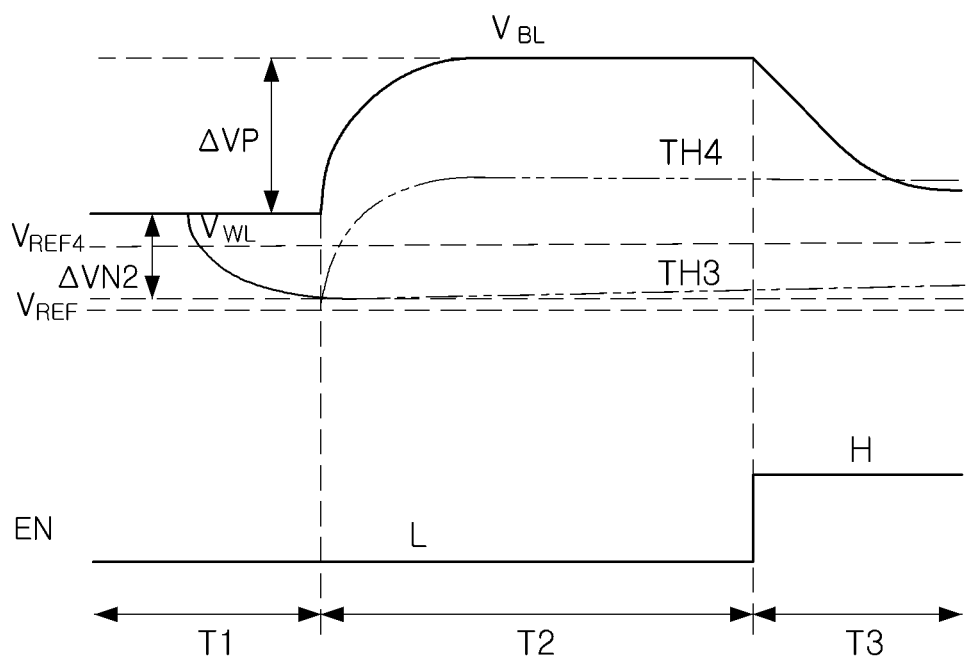

In the verification operation according to an example embodiment illustrated in FIG. 23, a magnitude ΔVP of the bit line voltage $V_{BL}$ input into the bit line connected to the target memory cell may be substantially identical to a magnitude of a voltage input into the bit line in the general read operation. In contrast, a magnitude ΔVN2 of the word line voltage $V_{WL}$ input into the word line connected to the target memory cell may be lower than a magnitude of a voltage input into the word line in the general read operation. As the word line voltage $V_{WL}$ is a negative voltage, it will be understood that a higher word line voltage $V_{WL}$ may be used in the verification operation than in the read operation.

The memory controller of the memory device may execute a repair operation on the target memory cell, which is turned on by the verification voltage $V_{VFY}$. As an example, a threshold voltage of the target memory cell turned on by the verification voltage $V_{VFY}$ may be included in the fourth sub range TH4.

In an example embodiment illustrated in FIG. 23, a magnitude ΔVN2 of the word line voltage $V_{WL}$, instead of the bit line voltage $V_{BL}$, is reduced to execute the verification operation. In this regard, when the verification voltage $V_{VFY}$ is maintained as input into sense amplifier, the memory cells having a threshold voltage in the third sub range TH3 and those in the fourth sub range TH4 may not be distinguished. Alternatively, accuracy of the verification operation may be deteriorated due to reduced sensing margins of the memory cells having a threshold voltage in the third sub range TH3. Referring to FIG. 23, the reference voltage $V_{REF}$ input into the sense amplifier is increased to a fourth verification reference voltage $V_{REF4}$ to solve such problems.

Figure 24:
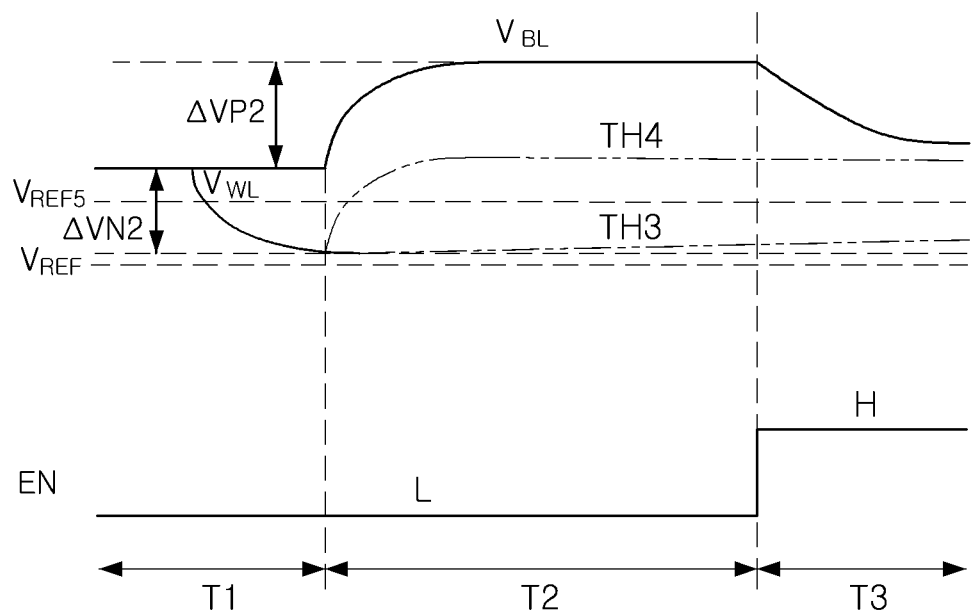

During the verification operation according to an example embodiment illustrated in FIG. 24, both a magnitude ΔVP2 of the bit line voltage $V_{BL}$ and a magnitude ΔVN2 of the word line voltages $V_{WL}$ may be reduced, as compared to the general read operation. Alternatively, the reference voltage $V_{REF}$ input into the sense amplifier may be adjusted to a fifth verification reference voltage $V_{REF5}$ such that the memory cells having a threshold voltage in the third sub range TH3 and those in the fourth sub range TH4 are clearly distinguished. In the example embodiments described with reference to FIGS. 22 to 25, a magnitude of each of the verification reference voltages $V_{REF3}$, $V_{REF4}$ and $V_{REF5}$ input into the sense amplifier may be determined by the bit line voltage $V_{BL}$ and the word line voltage $V_{WL}$.

Figure 25:
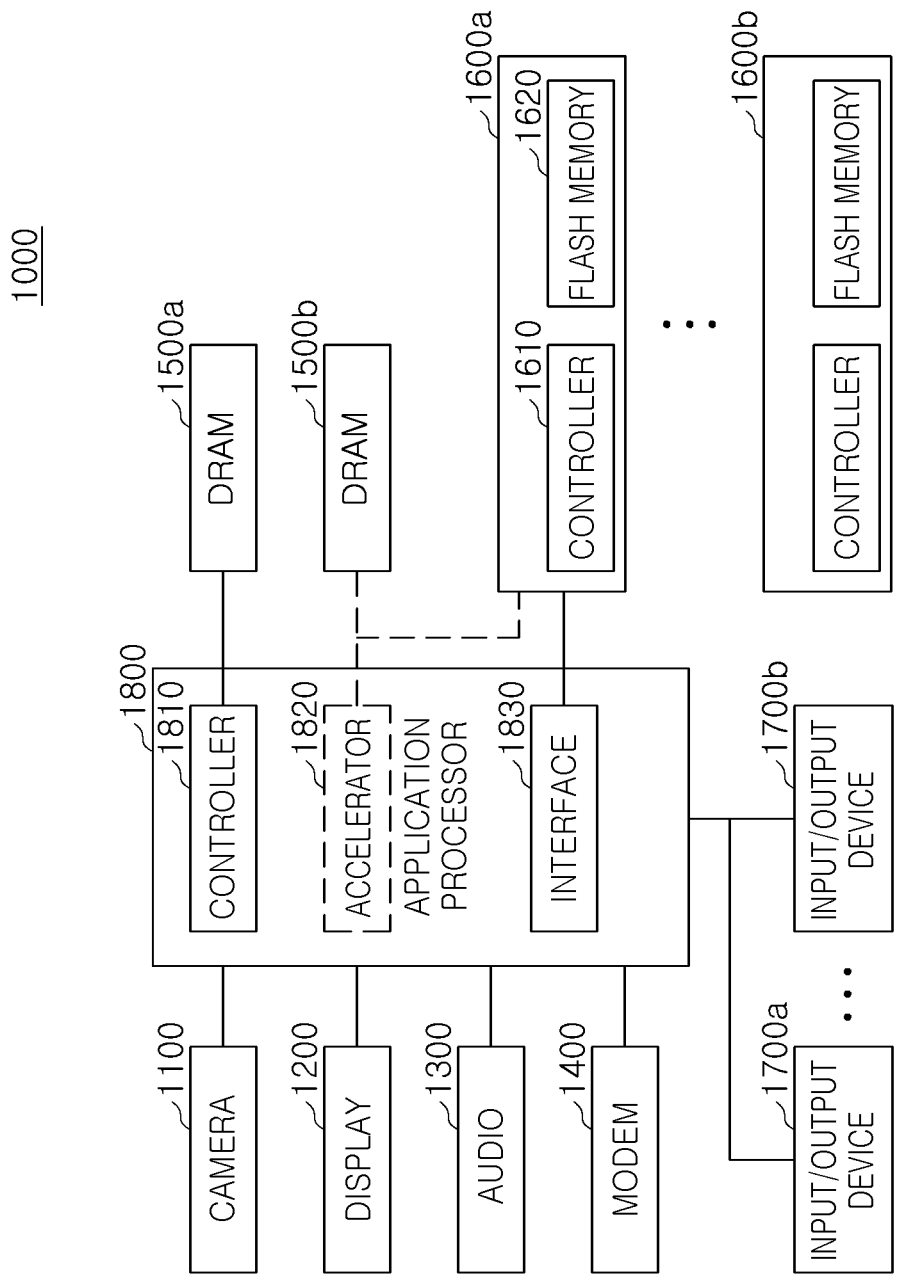
FIG. 25 is a block diagram illustrating a mobile system including a memory device according to an example embodiment of the present disclosure.

FIG. 25 is a block diagram illustrating a mobile system including a memory device according to an example embodiment.

Referring to FIG. 25, a mobile system 1000 may include a camera 1100, a display 1200, an audio processor 1300, a modem 1400, DRAMs 1500a and 1500b, and flash memory devices 1600a and 1600b, input/output devices 1700a and 1700b, and an application processor (hereinafter, "AP") 1800.

The mobile system 1000 may be implemented as a laptop computer, a portable terminal, a smartphone, a tablet personal computer (table PC), a wearable device, a healthcare device, or an Internet-of-Things (IoT) device. The mobile system 1000 may also be implemented as a server or a PC.

The camera 1100 may capture a still image or a video under control of a user. The mobile system 1000 may obtain particular information using the still image/video captured by the camera 1100 or may convert and store the still image/video into other types of data, such as text. Alternatively, the mobile system 1000 may recognize a character string included in the still image/video captured by the camera 1100 to provide a text or audio translation corresponding to the character string. As noted above, the camera 1100 in the mobile system 1000 can be used in various fields of application. In an example embodiment, the camera 1100 may transmit data, such as a still image/video, to the AP 1800 depending on a D-PHY or C-PHY interface according to the MIPI standard.

The display 1200 may be implemented in various forms, such as a liquid crystal display (LCD), an organic light emitting diodes (OLED) display, an active-matrix organic light emitting diodes (AMOLED) display, a plasma display panel (PDP), a field emission display (FED), an electronic paper, or the like. In an example embodiment, the display 1200 may provide a touchscreen function to be used also as an input device of the mobile system 1000. In addition, the display 1200 may be integrated with a fingerprint sensor, or the like, to provide a security function of the mobile system 1000. In an example embodiment, the AP 1800 may transmit image data, which are to be displayed on the display 1200 depending on the D-PHY or C-PHY interface according to the MIPI standard, to the display 1200.

The audio processing unit 1300 may process audio data stored in flash memory devices 1600a and 1600b or those included in contents received from outside (e.g., from an external device) through the modem 1400 and/or the input/output devices 1700a and 1700b. For example, the audio processing unit 1300 may execute various processes such as coding/decoding, amplification, and noise filtering, or the like, on the audio data.

For transmission and receipt of wired/wireless data, the modem 1400 can modulate a signal to transmit as well as demodulating a signal received from outside to restore an original signal. The input/output devices 1700a and 1700b, as a device for providing digital input and output, may include a port connectable to an external writing medium; an input device, such as a touchscreen, a mechanical button key, or the like; an output device capable of outputting a vibration in a haptic manner, or the like. In some examples, the input/output devices 1700a and 1700b may be connected to an external writing medium through a port such as a USB, a lightning cable, an SD card, a micro SD card, a DVD, a network adapter, or the like.

The AP 1800 may control an overall operation of the mobile system 1000. Specifically, the AP 1800 may control the display 1200 such that a portion of the contents stored in the flash memory devices 1600a and 1600b is displayed on a screen. When a user input is received through the input/output devices 1700a and 1700b, the AP 1800 may execute a control operation corresponding to the user input.

The AP 1800 may be provided as a system-on-chip (SoC) driving an application program, an operating system (OS), or the like. In addition, the AP 1800 may be included in a single semiconductor package together with other devices included in the mobile system 1000, for example, a DRAM 1500a, a flash memory 1620, and/or a memory controller 1610. For example, the AP 1800 and at least one device may be provided in a package form such as a package-on-package (PoP), ball grid arrays (BGAs), chip scale packages (CSPs), a system-in-package (SIP), a multi-chip package (MCP), a wafer-level fabricated package (WFP), a wafer-level processed stack package (WSP), etc. A kernel of the operating system driven on the AP 1800 may include a device driver for controlling an input/output scheduler and the flash memory devices 1600a and 1600b. The device driver may control access performance of the flash memory devices 1600a and 1600b based on a number of synchronous queues managed by the input/output scheduler, or may control a CPU mode, a dynamic voltage and frequency scaling (DVFS) level, or the like, inside the SoC.

In an example embodiment, the AP 1800 may include a processor block executing an operation or driving an application program and/or an operating system, and other various peripheral elements connected to the processor block through a system bus. The peripheral elements may include a memory controller, an internal memory, a power management block, an error detection block, a monitoring block, or the like. The processor block may include one or more cores. When a plurality of the cores are included in the processor block, each core may include a cache memory, and a common cache shared by the cores may be included in the processor block.

In one embodiment, the AP 1800 may include an accelerator block 1820, a circuit dedicated for an AI data operation. Alternatively, depending on example embodiments, a separate accelerator chip separated from the AP 1800 may be provided, or a DRAM 1500b may be additionally connected to the accelerator block 1820 or an accelerator chip. The accelerator block 1820 may be a functional block specialized in executing a specific function of the AP 1800 and may include a graphics processing unit (GPU) specialized in processing graphics data, a neural processing unit (NPU) specialized in executing AI calculations and interference, a data processing unit (DPU) specialized in data transmission, or the like.

Depending on example embodiments, the mobile system 1000 may include a plurality of DRAMs 1500a and 1500b. In an example embodiment, the AP 1800 may include a controller 1810 for controlling the DRAM 1500a and 1500b, and the DRAM 1500a may be directly connected to the AP 1800.

The AP 1800 may set a command and a mode register set (MRS) according to JEDEC standards to control a DRAM or set specifications and functions, such as a low voltage, high speed, and reliability, required by the mobile system 1000 and DRAM interface protocols for CRC/ECC to communicate. For example, the AP 1800 may communicate with the DRAM 1500a using an interface according to the JEDEC standards, such as LPDDR4, LPDDR5, or the like. Alternatively, the AP 1800 may set new DRAM interface protocols to control the DRAM 1500b for an accelerator, in which an accelerator chip provided independently of the accelerator block 1820 or the AP 1800 has a higher bandwidth than the DRAM 1500a, to communicate.

FIG. 25 illustrates the DRAMs 1500a and 1500b only; however, a configuration of the mobile system 1000 is not necessarily limited thereto. Memory types other than the DRAMs 1500a and 1500b may be included in the mobile system according to a bandwidth and a reaction speed of the accelerator block 1820 or the AP 1800. As an example, the controller 1810 and/or the accelerator block 1820 may control various memory types such as a PRAM, an SRAM, an MRAM, an RRAM, an FRAM, a hybrid RAM, or the like. The DRAMs 1500a and 1500b have relatively low latency and a relatively high bandwidth as compared to the input/output devices 1700a and 1700b or the flash memory devices 1600a and 1600b. The DRAMs 1500a and 1500b may be initialized at a power-on time of the mobile system 1000. When an operating system and application data are loaded, the DRAMs 1500a and 1500b may be used as a temporary storage for the operating system and the application data or an execution space of various software codes.

Four basic arithmetic operations of addition, subtraction, multiplication, and division, and data of vector operations, address operations, or FFT operations, may be stored in the DRAMs 1500a and 1500b. In another example embodiment, the DRAMs 1500a and 1500b may be provided as a processing in memory (PIM) having an operational function. As an example, inference functions may be executed in the DRAMs 1500a and 1500b. In this case, the inference may be executed in a deep learning algorithm using an artificial neural network. The deep learning algorithm may include a training step involving learning a model through various data and an inference step involving recognizing data with the trained model. For example, a function used in the inference may include a hyperbolic tangent function, a sigmoid function, a rectified linear unit (ReLU) function, or the like.

As an example embodiment, an image captured by a user with a camera 1100 may be signal-processed and stored in the DRAM 1500b, and the accelerator block 1820 or the accelerator chip may execute an AI data operation of recognizing data using the data stored in the DRAM 1500*b* and the functions used in the inference.

According to an example embodiment, the mobile system 1000 may include a plurality of storage or a plurality of flash memory devices 1600*a* and 1600*b* having higher capacity than the DRAMs 1500*a* and 1500*b*. The flash memory devices 1600*a* and 1600*b* may include a controller 1610 and a flash memory 1620. The controller 1610 may receive a control command, data, or the like, from the AP 1800 and may record data in the flash memory 1620 in response to the control command or may read the data stored in the flash memory 1620 to transmit to the AP 1800.

According to an example embodiment, the accelerator block 1820 or the accelerator chip may execute the training step and the AI data operation using the flash memory devices 1600*a* and 1600*b*. As an example embodiment, an operational logic, capable of executing a predetermined operation, may be implemented in the controller 1610 in the flash memory devices 1600*a* and 1600*b*. The operational logic may use the data stored in the flash memory 1620 to execute at least a portion of the training step and the interference AI data operation in place of the AP 1800 and/or the accelerator block 1820.

As an example, the operational logic may execute the AI data operation, such as a convolution operation, or the like, and data required for the operation of the operational logic may be stored in the flash memory 1620. As an example, data required for the operational logic is distributed according to a number of bit digits and may be stored in two or more memory cells connected to a single bit line. The controller 1610 may execute a program operation such that a first memory cell, in which most significant-bit data are stored, has a bigger sensing margin as compared to a second memory cell, in which least significant-bit data are stored.

The controller 1610 reads the data stored in the first memory cell and the second memory cell to provide the data to the operational logic such that the operational logic can execute an operation. As an example, the controller 1610 may execute a first read operation on the first memory cell and a second read operation on the second memory cell in different manners. In an example embodiment, different magnitudes of currents may be used in development operations of the first read operation and the second read operation. Alternatively, the data read by the first read operation and the second read operation may be stored in data latches having different trip voltages.

Further, the controller may skip error detection and correction processes during the first read operation and the second read operation. This is because the most significant-bit data, which may have a relatively large effect on accuracy of the operation executed by the operational logic, cannot be stored in the first memory cell programmed to have a large sensing margin. In other words, due to the large sensing margin, the most significant bit-data read from the first memory cell can be assumed that there is no error, and accordingly, the error detection and correction processes can be skipped to increase an operation processing speed and implement approximate computing.

In an example embodiment, the AP 1800 may include an interface 1830, and accordingly, the flash memory devices 1600*a* and 1600*b* may be directly connected to the AP 1800. For example, the AP 1800 may be implemented as an SoC, and the flash memory device 1600*a* may be implemented as a separate chip, different from the AP 1800, while the AP 1800 and the flash memory device 1600*a* may be mounted in a single package. However, the example embodiments are not limited thereto. A plurality of the flash memory devices 1600*a* and 1600*b* may be electrically connected to the mobile system 1000 through a connection.

The flash memory devices 1600*a* and 1600*b* may store data, such as a still image/video, captured by the camera 1100 or data received through a communications network and/or a port included in the input/output devices 1700*a* and 1700*b*. For example, the flash memory devices 1600*a* and 1600*b* may store augmented reality/virtual reality and high definition (HD) or ultra high definition (UHD) contents.

At least one of the DRAMs 1500*a* and 1500*b* or the flash memory devices 1600*a* and 1600*b* may be implemented as memory devices according to the example embodiments of the present disclosure. As an example, at least one of the DRAMs 1500*a* and 1500*b* or the flash memory devices 1600*a* and 1600*b* may execute the verification operation according to the example embodiments at predetermined cycles (e.g., at predetermined time(s) and/or after execution of predetermined number(s) of control operations), and if necessary, may execute a refresh operation and/or a repair operation. Accordingly, the operational performance and reliability of the mobile system 1000 can be improved.

According to an embodiment of the present disclosure, a memory device detects a change in threshold voltages of memory cells to selectively execute a refresh operation and/or a repair operation. Accordingly, reliability and performance of the memory device may be improved.

Various and advantageous advantages and effects of the present disclosure may be not limited to the above description, and may be more easily understood in the course of describing a specific embodiment of the present disclosure.

While the present disclosure has been shown and described with reference to example embodiments thereof, it will be apparent to those skilled in the art that modifications and variations could be made thereto without departing from the scope of the present disclosure as defined by the appended claims.

What is claimed is:

1. A memory device, comprising:
   a memory cell array comprising a plurality of memory cells connected to a plurality of word lines and a plurality of bit lines, wherein each of the plurality of memory cells comprises a switch element and a memory element connected to each other, and wherein each of the plurality of memory cells has a first state in which a threshold voltage is within a first voltage range or a second state in which the threshold voltage is within a second voltage range that is lower than the first voltage range; and
   a memory controller configured to execute a first read operation for the plurality of memory cells using a first read voltage that is higher than a median value of the first voltage range, program first defect memory cells of the plurality of memory cells that are turned off during the first read operation to the first state, execute a second read operation for the plurality of memory cells using a second read voltage that is lower than a median value of the second voltage range, and execute a repair operation for second defect memory cells of the plurality of memory cells that are turned on during the second read operation.

2. The memory device of claim 1, wherein the memory controller is configured to apply a maximum read voltage to the plurality of memory cells, and wherein the first read voltage is less than the maximum read voltage and is greater than or equal to 0.8 times the maximum read voltage.

3. The memory device of claim 1, wherein the memory controller is configured to apply a minimum read voltage to the plurality of memory cells, and wherein the second read voltage is greater than the minimum read voltage and is less than or equal to 1.2 times the minimum read voltage.

4. The memory device of claim 1, wherein the repair operation comprises replacing the second defect memory cells with redundant memory cells.

5. The memory device of claim 1, wherein the memory controller is configured to execute the first read operation and the second read operation at predetermined cycles.

6. The memory device of claim 5, wherein the predetermined cycles are determined by at least one of a predetermined period of time or a predetermined number of control operations.

7. The memory device of claim 1, wherein the first read voltage is higher than a maximum value of the first voltage range.

8. The memory device of claim 1, wherein the second read voltage is lower than a minimum value of the second voltage range.

9. The memory device of claim 8, wherein the memory controller is configured to execute the first read operation but not the second read operation for first memory cells, among the plurality of memory cells, having the first state.

10. The memory device of claim 1, wherein the memory controller is configured to execute the second read operation but not the first read operation for second memory cells, among the plurality of memory cells, having the second state.

11. A memory device, comprising:
a plurality of memory cells connected to a plurality of word lines and a plurality of bit lines, each of the plurality of memory cells having a respective threshold voltage that is equal to or lower than a first threshold voltage and equal to or higher than a second threshold voltage; and
a memory controller configured to execute, for a target memory cell among the plurality of memory cells, a verification operation by applying at least one of a first verification voltage that is higher than the first threshold voltage or a second verification voltage that is lower than the second threshold voltage,
wherein the memory controller is configured to execute a refresh operation for the target memory cell responsive to the respective threshold voltage of the target memory cell being higher than the first verification voltage, and
wherein the memory controller is configured to execute a repair operation for the target memory cell responsive to the respective threshold voltage of the target memory cell being lower than or equal to the second verification voltage.

12. The memory device of claim 11, wherein a first program operation is configured to set a first memory cell state and a second program operation is configured to set a second memory cell state, and
wherein the respective threshold voltage of a selected memory cell among the plurality of memory cells is equal to or lower than the first threshold voltage associated with the first memory cell state and the respective threshold voltage of the selected memory cell is equal to or higher than the second threshold voltage associated with the second memory cell state.

13. The memory device of claim 11, wherein the memory controller is configured to execute the verification operation responsive to a predetermined period of time elapsing after a program operation is executed for the target memory cell.

14. The memory device of claim 11, wherein the memory controller is configured to use a read voltage lower than the first threshold voltage and higher than the second threshold voltage to execute a read operation on a selected memory cell among the plurality of memory cells.

15. A memory device, comprising:
a memory cell array comprising a plurality of memory cells connected to a plurality of word lines and a plurality of bit lines, wherein each of the plurality of memory cells has a first state having a first threshold voltage in a first voltage range or a second state having a second threshold voltage in a second voltage range that is lower than the first voltage range; and
a memory controller configured to execute a verification operation for the plurality of memory cells using a verification voltage that is higher than a maximum value of the first voltage range or lower than a minimum value of the second voltage range, and execute a read operation for the plurality of memory cells using a read voltage that is equal to or lower than a minimum value of the first voltage range and equal to or higher than a maximum value of the second voltage range,
wherein the memory controller is configured to apply a first bit line voltage to the plurality of bit lines during the read operation, and is configured to apply a second bit line voltage that is different from the first bit line voltage to the plurality of bit lines during the verification operation.

16. The memory device of claim 15, wherein the memory controller is configured to apply a first word line voltage to the plurality of word lines during the read operation, and is configured to apply a second word line voltage that is different from the first word line voltage to the plurality of word lines during the verification operation, and
wherein the read voltage is determined by a difference between the first bit line voltage and the first word line voltage, and the verification voltage is determined by a difference between the second bit line voltage and the second word line voltage.

17. The memory device of claim 16, wherein the first word line voltage and the second word line voltage are negative voltages, and the first bit line voltage and the second bit line voltage are positive voltages.

18. The memory device of claim 17, wherein the memory controller is configured to decrease the first word line voltage or increase the first bit line voltage to apply the verification voltage higher than the maximum value of the first voltage range to a target memory cell, among the plurality of memory cells.

19. The memory device of claim 17, wherein the memory controller is configured to increase the first word line voltage or decrease the first bit line voltage to apply the verification voltage lower than the minimum value of the second voltage range to a target memory cell, among the plurality of memory cells.

20. The memory device of claim 15, wherein the memory controller comprises sense amplifiers connected to the plurality of word lines and configured to compare a respective threshold voltage read from at least one of the plurality of memory cells with respective reference voltages during the read operation and the verification operation,
wherein the respective reference voltages have different magnitudes in the read operation and the verification operation.

* * * * *